(12) United States Patent
Nishimura et al.

(10) Patent No.: US 7,687,319 B2
(45) Date of Patent: Mar. 30, 2010

(54) SEMICONDUCTOR DEVICE AND MANUFACTURING METHOD THEREOF

(75) Inventors: Takao Nishimura, Kawasaki (JP); Kouichi Nakamura, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 130 days.

(21) Appl. No.: 12/098,710

(22) Filed: Apr. 7, 2008

(65) Prior Publication Data
US 2008/0188058 A1  Aug. 7, 2008

Related U.S. Application Data

(63) Continuation of application No. PCT/JP2005/018557, filed on Oct. 6, 2005.

(51) Int. Cl.
H01L 21/50 (2006.01)
H01L 21/48 (2006.01)
H01L 21/44 (2006.01)
H01L 23/52 (2006.01)
H01L 23/48 (2006.01)
H01L 29/40 (2006.01)
H01L 23/485 (2006.01)

(52) U.S. Cl. ............ 438/118; 438/108; 257/783; 257/778; 257/780; 257/E23.021

(58) Field of Classification Search .......... 438/118, 438/108; 257/783, 778, 780, E23.021
See application file for complete search history.

(56) References Cited

U.S. PATENT DOCUMENTS 6,449,838 B2   9/2002   Murakami
6,861,278 B2 * 3/2005   Quinones et al. .......... 438/51
6,926,190 B2 * 8/2005   Jiang et al. ............ 228/180.22
2005/0028361 A1 * 2/2005   Yin et al. .............. 29/841

FOREIGN PATENT DOCUMENTS

| JP | 60-262430 A | 12/1985 |
| JP | 09-97816 A | 4/1997 |
| JP | 11-87420 A | 3/1999 |
| JP | 2000-100870 A | 4/2000 |
| JP | 2001-127194 A | 5/2001 |
| JP | 2001-244298 A | 9/2001 |
| JP | 2005-150446 A | 6/2005 |

OTHER PUBLICATIONS

International Search Report of PCT/JP2005/018557, date of mailing Mar. 20, 2006.

* cited by examiner

*Primary Examiner*—Luan C Thai
(74) *Attorney, Agent, or Firm*—Westerman, Hattori, Daniels & Adrian, LLP

(57) ABSTRACT

The present invention provides a method for manufacturing a semiconductor device which includes at least supplying an adhesive for bonding an electronic component which has a plurality of bumps with a substrate which has a plurality of bonding pads corresponding to the bumps, to at least a portion of the substrate, between the electronic component and the substrate, flow-casting the adhesive on the substrate by a flow-casting unit, in such a manner that the expression $S_1/S_0 > 1$ is satisfied, where $S_0$ is the total contact surface area with the substrate of the adhesive supplied to the substrate, and $S_1$ is the total contact surface area with the substrate of the adhesive after the flow-casting, and curing the adhesive while making the adhesive contact with the electronic component and the substrate in a state where the bumps are abutted against the bonding pads.

17 Claims, 14 Drawing Sheets

SEMICONDUCTOR DEVICE AND MANUFACTURING METHOD THEREOF

CROSS-REFERENCE TO RELATED APPLICATIONS

This is a continuation application of PCT/JP2005/018557, filed on Oct. 6, 2005.

BACKGROUND OF THE INVENTION

1. Field of the Invention

The present invention relates to a semiconductor device having high performance and high reliability, in which an electronic component is mounted on a substrate by using an adhesive (for example, by flip chip mounting), and the occurrence of gas bubbles inside the adhesive is reduced, and also relates to a method for manufacturing such a semiconductor device at low cost and with high efficiency.

2. Description of the Related Art

Conventionally, flip chip mounting is used as a method for mounting electronic components on a substrate, since the manufacturing process is straightforward, and allows rapid and inexpensive mounting. As a flip chip mounting method, for example, there is known a method in which an adhesive is supplied previously onto a substrate, an electronic component (for example, a semiconductor chip) formed with bumps composed of metal, or the like, on electrode pads is placed opposing the substrate, a load is applied to the semiconductor chip, and the adhesive is cured, thereby connecting (mounting) the semiconductor chip on the substrate (see Japanese Patent Application Laid-Open (JP-A) Nos. 60-262430 and 09-97816). Furthermore, a suitable adhesive is a thermoplastic insulating resin, such as an epoxy resin, for example, since it can be cured in a short period of time.

In the flip chip mounting described above, a heated semiconductor chip is pressed against the adhesive by heating the semiconductor chip to a prescribed temperature while applying pressure. In so doing, the adhesive is heated rapidly, the viscosity thereof falls and the fluidity increases, and therefore the adhesive is pushed so as to extend over the whole surface of the semiconductor chip. Furthermore, during this, thermal curing proceeds simultaneously and the adhesive becomes cured. Due to the adhesive force of the cured adhesive and the curing and contracting action, the bumps formed on the electrode pads of the semiconductor chip become connected to the bonding terminals formed on the substrate, while being maintained in a state of pressurized contact with these bonding terminals.

However, in flip chip mounting of this type, there is a problem in that gas bubbles occur inside the cured adhesive. If the adhesive contains gas bubbles, then due to the moisture content inside the gas bubbles, when the semiconductor device is mounted on a motherboard, or the like, by reflow soldering, then swelling or delamination, or the like, occurs in the adhesive due to the explosion of the water vapor, and this may lead to connection faults in the bump junction sections, or the like. Furthermore, if gas bubbles are present in the vicinity of the bump junctions, then due to the effects of the moisture and impurity ions in the bubbles, and the like, electric current leakage arises between mutually adjacent bumps, leading to degradation of the properties of the semiconductor device or to malfunction of the device, and hence the presence of gas bubbles inside the adhesive has a detrimental effect on the reliability of the semiconductor device.

Possible reasons for the occurrence of gas bubbles include, for example: the incorporation of air bubbles into the adhesive when the adhesive is applied to the substrate, the generation of gas bubbles due to gas arising from the adhesive or the substrate (for example, a resin substrate) during heating, or the incorporation of air bubbles into the adhesive during the flowing movement of the adhesive when it is pushed and spread. These gas bubbles often occur in the vicinity of the interface with the substrate, and since the substrate has undulations in the interface with the adhesive, particularly in the wiring sections (interconnection sections) and the bonding terminal sections on the substrate, then the gas bubbles are liable to enter into these undulations during the flowing movement and curing of the adhesive.

It is possible to use an adhesive in any form, such as a film or a paste, but an adhesive in the form of a film has virtually no fluidity and therefore when the adhesive is attached to a substrate, a large number of bubbles may be incorporated at the interface with the substrate where undulations are present, and hence gas bubbles are more liable to occur in the vicinity of the interface with the substrate, in comparison with an adhesive in the form of a paste.

In recent years, in accordance with increasing integration of semiconductor chips, the pitch between bumps has become extremely fine, the size of bumps has become smaller and the height of bumps has become lower. Furthermore, in response to the increasingly fine bump pitch, the bonding terminals and wires on the substrate have also become increasing fine. Therefore, the undulations present at the interface between the adhesive and the substrate have become finer, and in the flip chip mounting method described above, gas bubbles become more liable to enter into these finer undulations. As the bump pitch becomes finer and the bump height becomes lower in this way, then the gap between the semiconductor chip and the substrate after flip chip mounting becomes smaller and the thickness of the adhesive layer becomes thinner. Therefore, the relative size of the gas bubbles with respect to this thickness increases and gas bubbles of a size which are not problematic conventionally give rise to the problems described above.

As a method for resolving the problem of the generation of air bubbles, a flip chip connection method has been proposed which includes, for example, a first step of applying an adhesive made of a thermally curable resin onto the surface of a wiring substrate, a second step of holding a bare chip with a heating tool, mutually aligning the positions of the bumps on the bare chip and the pads on the wiring substrate by placing the element forming surface of the bare chip toward the surface of the wiring substrate, and heating the bare chip via the heating tool, and a third step of abutting the bumps against the pads and curing same, by pressurizing the heated bare chip toward the wiring substrate (see Japanese Patent Application Laid-Open (JP-A) No. 2001-244298). In this case, before applying pressure, the heating tool which lies in contact with the adhesive is heated, thereby causing the adhesive to flow, whereupon pressurization is started, and furthermore, since the heating tool is heated in a stepwise fashion during each flip chip mounting operation, then it is difficult to shorten the mounting time. Furthermore, if bonding is repeated in a continuous operation, then time is required to allow the heating tool to cool after each flip chip mounting operation, and therefore reduction of the mounting time is also difficult for this reason. Consequently, there is a problem in that the productivity is low and cost reductions cannot be achieved.

Furthermore, as a method for manufacturing a semiconductor component in which a flip chip is mounted on a substrate circuit, a method has been proposed in which, firstly, a liquid resin layer having a convex spherical upper surface is formed to a planar shape corresponding to the flip chip, on the substrate circuit, by using a stencil printing unit in vacuum conditions, whereupon the flip chip is aligned in position and mounted on the resin layer, and the flip chip is then pressure bonded while heating, onto the substrate circuit (see Japanese Patent Application Laid-Open (JP-A) No. 2000-100870). In this case, since the application of an adhesive is performed by stencil printing in a vacuum, then when the members are introduced into the vacuum chamber and removed from the vacuum chamber, time is required to reduce the atmosphere to a vacuum and then return the atmosphere to normal pressure, and hence there is a problem of low productivity. Furthermore, since manufacturing equipment provided with a vacuum chamber is required, then this gives rise to higher costs. Moreover, with stencil printing, it is difficult to control the supply of an adhesive in very small quantities, and therefore it is not possible to respond to very small gaps or very fine pitches. Furthermore, a printing mask which corresponds to the size of the chip being mounted is required, and therefore it is difficult to achieve a low-cost operation.

Moreover, there has also been a proposal of a semiconductor device having a flip chip structure in which a semiconductor chip, and a circuit substrate having electrodes at positions opposing electrodes on a surface opposing the semiconductor chip, are connected electrically via a connecting resin, by means of a flip chip technique, wherein through holes, which are situated to the outer side of the outer circumference of the semiconductor chip and at least partially situated inside the region where the circuit substrate is covered with the connecting resin, are provided in the circuit substrate (see Japanese Patent Application Laid-Open (JP-A) No. 2001-127194). The through holes in the semiconductor device are provided to form channels for the purpose of facilitating the removal of humidity from the region of gas bubbles, rather than suppressing the actual occurrence of gas bubbles, and in addition to restricting the freedom of design of the substrate, forming such through holes may also obstruct the formation of fine wiring and give rise to increase in the substrate manufacturing costs and increase in the size of the semiconductor device.

Consequently, at present, a semiconductor device having high performance and high reliability, in which the occurrence of gas bubbles inside the adhesive when mounting an electronic component onto a substrate by using an adhesive (for example, flip chip mounting) is reduced, and a method for manufacturing such a semiconductor device at low cost and with high efficiency, have not yet been proposed, and the development of technology capable of reducing the occurrence of gas bubbles inside the adhesive is sought, particularly in cases where the bump pitch is very fine.

BRIEF SUMMARY OF THE INVENTION

It is an object of the present invention to provide a semiconductor device having high performance and high reliability, in which an electronic component is mounted on a substrate by using an adhesive (for example, by flip chip mounting), and the occurrence of gas bubbles inside the adhesive is reduced, and to provide a method for manufacturing the same with high efficiency at low cost.

The means for resolving the problems described above are as follows: Namely,

The method for manufacturing a semiconductor device of the present invention includes at least supplying an adhesive for bonding an electronic component which has a plurality of bumps with a substrate which has a plurality of bonding pads corresponding to the bumps, to at least a portion of the substrate, between the electronic component and the substrate, flow-casting the adhesive on the substrate by a flow-casting unit, in such a manner that the expression $S_1/S_0>1$ is satisfied, where $S_0$ is the total contact surface area with the substrate of the adhesive supplied to the substrate, and $S_1$ is the total contact surface area with the substrate of the adhesive after the flow-casting, and curing the adhesive while making the adhesive contact with the electronic component and the substrate in a state where the bumps are abutted against the bonding pads.

In this method of manufacturing a semiconductor device, in the supplying step, an adhesive for bonding the electronic component with the substrate is supplied to at least a portion of the substrate, between the electronic component, which has a plurality of bumps, and the substrate, which has a plurality of bonding pads corresponding to the bumps. In the flow-casting step, the adhesive is flow-cast by a flow-casting unit, in such a manner that the expression $S_1/S_0>1$ is satisfied, where $S_0$ is the total contact surface area with the substrate of the adhesive supplied to the substrate and $S_1$ is the total contact surface area with the substrate of the adhesive after the flow-casting. In this case, the adhesive that was supplied in the supplying step is flow-cast (by being pushed) over the substrate until reaching the region of the junction between the bumps and the bonding pads, and gas bubbles occurring in the gaps between the adhesive and the undulations present on the surface of the substrate are expelled. Therefore, it is possible to make the adhesive be present reliably on the surface of the substrate, without the occurrence of gaps. In the curing step, the adhesive is cured while making contact with (being filled in between) the electronic component and the substrate, in a state where the bumps are abutted against the bonding pads. As a result, when mounting the electronic component on the substrate (for example, by flip chip mounting), the occurrence of gas bubbles inside the adhesive in the vicinity of the interface with the substrate is suppressed, and a semiconductor device of high performance and high reliability can be manufactured at low cost and with high efficiency.

DETAILED DESCRIPTION OF THE INVENTION

Figure 1A:
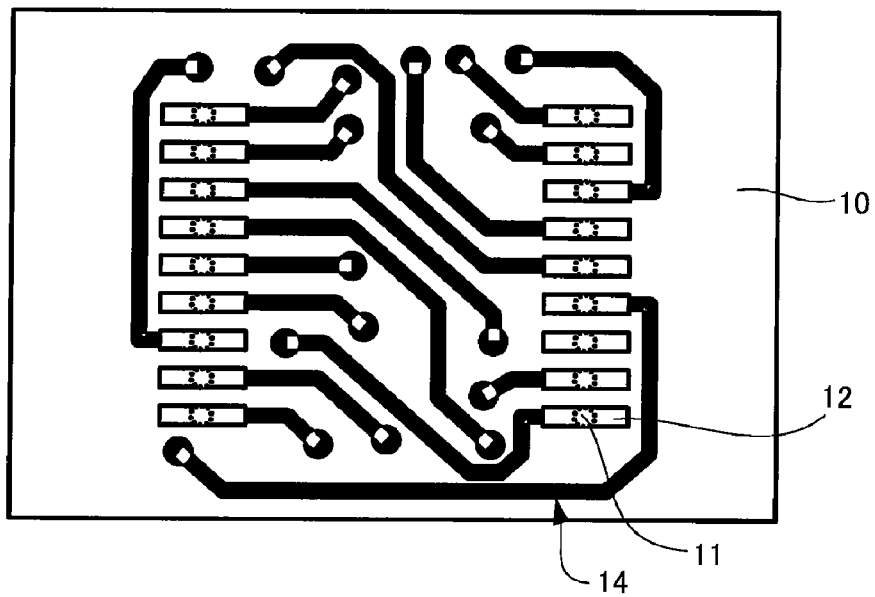
FIG. 1A is a schematic illustrative diagram showing one example of a substrate used in the method for manufacturing a semiconductor device according to the present invention.

Semiconductor Device and Method for Manufacturing the Same

The method for manufacturing a semiconductor device according to the present invention (hereinafter, also referred to as "method for mounting electronic components") includes at least a supplying step, a flow-casting step and a curing step, and may also include other steps, as chosen appropriately in accordance with requirements.

The semiconductor device according to the present invention is manufactured by the method for manufacturing a semiconductor device according to the present invention.

The details of the semiconductor device according to the present invention will be clarified through the following description of the method for manufacturing a semiconductor device according to the present invention.

(Supplying Step)

The supplying step is a step of supplying an adhesive for bonding an electronic component with a substrate, to at least a portion of the substrate, between the electronic component and the substrate.

—Electronic Component—

The electronic component has at least a plurality of bumps and also has other members selected appropriately according to requirements.

There are no particular restrictions on the electronic component, and it may be selected appropriately according to the intended use, however, suitable examples are a semiconductor chip, a semiconductor package, or the like.

There are no particular restrictions on the material of the bumps, provided that they are electrical conductors, and they may be selected appropriately according to the intended use; possible examples of the material are gold, copper, solder, or the like.

There are no particular restrictions on the method for forming the bumps, and it may be selected appropriately according to the intended use; for example, the bumps may be formed by wire bonding, plating, transfer, or the like.

There are no particular restrictions on the interval between bumps (bump pitch), and it may be selected appropriately according to the intended use; however, in the case of gold bumps and copper bumps formed by a wire bonding method, the bump pitch is generally 35 µm to 120 µm, in the case of gold bumps and copper bumps formed by a plating method, the bump pitch is generally 20 µm to 80 µm, and in the case of solder bumps formed by a plating or transfer method, the bump pitch is generally 35 µm to 300 µm, however, in any of these cases, desirably, the bump pitch is 40 µm or less.

If the bump pitch is 40 µm or less, then there is marked occurrence of gas bubbles and there is a latent problem of deterioration in the properties of the semiconductor device due to connection faults in the bump junctions or electric current leakage between mutually adjacent bumps, or the like. However, in the semiconductor device according to the present invention which is manufactured by the method for manufacturing a semiconductor device according to the present invention (where the electronic component is mounted on the substrate), even in cases where the bump pitch is extremely fine, namely, 40 µm or less, the occurrence of gas bubbles inside the adhesive is reduced and therefore high performance and high reliability are achieved.

—Substrate—

The substrate has at least a plurality of bonding pads which correspond to the bumps, and also has other members selected according to requirements.

There are no particular restrictions on the substrate, and the material, shape, structure, thickness, and the like, of the substrate can be selected appropriately from those commonly known in the art. However, it is desirable that the substrate have insulating properties.

There are no particular restrictions on a substrate having insulating properties, and such a substrate may be selected appropriately according to the intended use, possible examples being an organic substrate, an inorganic substrate, or the like.

Possible examples of an organic substrate are a glass BT (bismaleide triazine resin) substrate, a glass epoxy substrate, a polyimide substrate, or the like, and possible examples of an inorganic substrate are a ceramic substrate, a glass substrate, a silicon substrate, or the like.

There are no particular restrictions on the bonding pads, provided that they are electrical conductors, and possible materials for the bonding pads include copper, aluminum, gold, nickel, silver, or the like.

The bumps described above may be provided on top of the bonding pads, and the bonding pads may be connected to the bumps on the electronic component, by means of these bumps.

—Adhesive—

The adhesive has the function of bonding the electronic component and the substrate together, by being interposed between the electronic component and the substrate.

There are no particular restrictions on the adhesive, and the material, form, and the like, of the adhesive can be selected appropriately.

There are no particular restrictions on the material of the adhesive, and it can be selected appropriately according to the intended use; however, suitably, it is a thermally curable insulating resin, and desirable examples are an epoxy resin, a phenol resin, a cyanate resin, or the like. It is possible either to use one type of resin independently, or to use a combination of two or more types of resin.

According to requirements, the adhesive may also contain additionally an inorganic filler, a metal filler, a coupling agent, a dispersant, a colorant, a releasing agent, or the like.

The form of the adhesive may be, for example, a paste, or a B stage film, but desirably, it is a paste. An adhesive in the form of a film has virtually no fluidity, and therefore, when the adhesive is applied to the substrate, gas bubbles may be incorporated at the interface with the substrate, which has undulations.

If the adhesive is in the form of a film, then it is desirable that the surface area of the region onto which the film adhesive is applied be smaller than the surface area of the mounting region of the electronic component on the substrate, in order to take account of the fact that the adhesive is pressed and caused to spread in the flow-casting step, which is described below.

The adhesive is supplied to at least a portion of the substrate.

There are no particular restrictions on the position at which the adhesive is supplied, provided that it is at least a portion of the substrate, and this position may be selected appropriately according to the intended use, but desirably, it is a region which includes at least the center of the mounting region of the electronic component on the substrate, since this allows the adhesive to flow and spread (by being pressed) readily and uniformly in all four directions on the substrate, in the flow-casting step which is described below.

There are no particular restrictions on the shape in which the adhesive is supplied to the substrate, and this shape can be selected appropriately according to the intended use, it being possible to supply the adhesive in a continuous form or in a non-continuous form.

A continuous form is a shape where the adhesive is formed in one region (rather than in a scattered fashion), and possible examples of such a shape are a circular shape, a polygonal shape, a non-uniform shape, a form combining these shapes, or the like.

A non-continuous form is, for instance, a pattern where adhesive is formed in a plurality of scattered regions, and possible examples of such a shape are a pattern consisting of a plurality of continuous forms, or a polka-dot pattern.

There are no particular restrictions on the method of supplying an adhesive, and the method can be selected appropriately according to the intended use; for example, if the adhesive is in the form of a paste, then a possible supply method is application by coating, and if the adhesive is in the form of a film, then a possible supply method is attachment.

If an adhesive in the form of a film is composed of a material having tacky properties, then the attachment step can be carried out at normal temperature, but since gaps may occur at the undulations which are present at the interface of the substrate, then it is desirable to heat at least any one of the substrate and the adhesive while attaching the film of an adhesive. In this case, the adhesive in the form of a film softens and develops tacky properties, thereby improving the filling properties of the adhesive into the undulations.

The adhesive is supplied to at least a portion of the substrate by means of the steps described above.

(Flow-Casting Step)

The flow-casting step is a step in which the adhesive is flow-cast by means of a flow-casting unit, in such a manner that the expression $S_1/S_0 > 1$ is satisfied, where $S_0$ is the total contact surface area between the substrate and the adhesive supplied to the substrate and $S_1$ is the total contact surface area between the substrate and the adhesive after the flow-casting.

If the expression $S_1/S_0>1$ is satisfied, then the adhesive that was supplied in the supplying step flows over the substrate and is pushed and caused to spread until the region of the junctions between the bumps and the bonding pads, and gas bubbles which occur in the gaps between the adhesive and the surface of the substrate are expelled to the exterior of the adhesive. Therefore, it is possible to make the adhesive be present reliably on the surface of the substrate, without the occurrence of gaps.

Furthermore, the total contact surface areas $S_0$ and $S_1$ between the substrate and the adhesive means the total surface area of the adhesive present on the substrate, and the supply shape of the adhesive on the substrate means, in the case of a continuous form, the surface area of the shape of the adhesive, and in the case of a non-continuous form, the total surface area of the adhesive constituting the non-continuous form (pattern).

—Flow-Casting Unit—

There are no particular restrictions on the form, structure, or other features, of the flow-casting unit, provided that it is able to cause the adhesive to flow and spread (by pushing the adhesive), in other words, to achieve the expression $S_1/S_1>1$ stated above, and flow-casting unit can be selected appropriately according to the intended use, suitable forms of the unit being, for example, a spherical shape, a bar shape, a plate shape, and the like. In this case, it is possible to cause the adhesive to extend and spread uniformly over the surface of the substrate.

The unit may have a structure with a hollow center or a structure with a solid center.

If a hollow-centered structure is adopted, then it is possible to make the flow-casting member from an elastic material, for example, and to fill the interior of the member with a gas, such as air, a fluid, such as water, or the like. In this case, the flow-casting member is, for example, formed in the manner of a balloon, and is made to have a flow-casting function by gradually being filled internally with a fluid, or the like, when flow-casting the adhesive, while the member can be returned to its original state by recovering the fluid, or the like, after the flow-casting of the adhesive.

Desirably, at least the surface of the flow-casting unit which contacts with the adhesive has non-adhesive properties with respect to the adhesive, and more specifically, desirably, it is formed of a fluorine resin. In this case, since the adhesive is flow-cast by using a surface made of a fluorine resin, then when the flow-casting unit is withdrawn from the adhesive after spreading and extending the adhesive, adherence of the adhesive to the flow-casting unit can be suppressed, which is beneficial in that the flow-casting operation can be carried out without causing any reduction of the amount of the adhesive supplied.

At least the surface of the flow-casting unit which makes contact with the adhesive may be made of a fluorine resin, and either the flow-casting unit itself may be made of a fluorine resin, or a fluorine resin coating may be formed on the surface of a member made of a material other than fluorine resin.

There are no particular restrictions on the fluorine resin and it may be selected appropriately according to the intended use, for example, it may be PTFE (polytetrafluoroethylene resin), ETFE (ethylene tetrafluoroethylene copolymer resin), PFA (tetrafluoroethylene-perfluoroalkyl vinyl ether copolymer resin), FEP (tetrafluoroethylene-hexafluoropropylene copolymer resin), or the like. Of these, ETFE is desirable for composing the flow-casting unit, from the viewpoints of processing formability and manufacturing costs, and furthermore, PFA is desirable for coating, from the viewpoint of being able to obtain a continuous film which is free of pinholes.

Furthermore, desirably, the flow-casting unit has a function of ejecting a compressed gas, and a possible example of the flow-casting unit is an ejection nozzle, or the like. In this case, the adhesive can be pushed and caused to extend over the substrate rapidly, by ejecting the compressed gas towards the adhesive that has been supplied to the substrate, and hence the productivity can be improved. Furthermore, since the adhesive can be flow-cast and spread without making contact with the adhesive, then a merit is obtained in that the adhesive can be pushed and caused to extend without reducing the amount of the adhesive that has been supplied.

The number of ejection nozzles may be one nozzle or a plurality of nozzles.

There are no particular restrictions on the compressed gas used, and it may be selected appropriately according to the intended use, possible examples being a compressed gas such as air, nitrogen, or the like.

Desirably, the compressed gas is a heated jet. In this case, it is possible to reduce the viscosity of the adhesive and to improve the fluidity of the adhesive.

There are no particular restrictions on the temperature of the heated gas jet, and it can be selected appropriately according to the intended use, but desirably, it is a temperature at which the adhesive is not thermally cured, and hence a temperature of approximately 50° C. to 120° C. is desirable.

There are no particular restrictions on the material, shape, structure, size, and other features, of the ejection nozzle, and these can be selected appropriately according to the intended use.

The material can be selected appropriately according to the nozzle diameter (processing accuracy), operating temperature, lifespan, operating pressure, cost, and the like, and possible examples of the material are a metal such as stainless steel, aluminum alloy, copper zinc alloy, or titanium, or a resin such as ABS, PPS, or the like.

The shape of the nozzle may be, for example, a single nozzle (single aperture), a tubular shape, a slit-shaped ejection section, or the like. Furthermore, the ejection section of the nozzle may be provided so as to eject the compressed gas in a perpendicular direction toward the substrate, and it may also be provided so as to eject the compressed gas in an oblique direction toward the substrate, by causing the front tip to bend toward the outer side of the substrate.

The diameter of the nozzle is selected appropriately according to the material properties (viscosity, tackiness) of the adhesive, the supply shape of the adhesive on the substrate, the surface pattern on the substrate, and the like, but desirably, the nozzle diameter is 0.05 mm to 1.0 mm, for instance.

The compressed gas may be ejected by the flow-casting unit by means of continuous ejection or by means of pulse ejection.

If the compressed gas is ejected by continuous ejection, then desirably, the compressed gas is ejected while varying the ejection pressure of the compressed gas. In this case, for example, if the ejection pressure of the compressed gas is increased gradually, or in a stepwise fashion, from the start of ejection until reaching a prescribed pressure, then unintentional scattering of the adhesive immediately after the start of ejection of the compressed gas is suppressed and therefore it is possible to improve the production yield.

The distance between the flow-casting unit and the substrate, and the ejection pressure, can be selected appropriately in accordance with the material properties (viscosity or tackiness) of the adhesive, the supply shape of the adhesive on the substrate, the wiring pattern formed on the surface of the substrate, and the like.

Desirably, this distance is 0.2 mm to 3.0 mm, for example.

In the case of continuous ejection, it is desirable that the ejection pressure be varied within a range of 0.02 MPa to 0.5 MPa, for example, and in the case of pulse ejection, the ejection pressure is desirably set to a prescribed pressure within this range.

If there is a plurality of ejection nozzles, then it is possible to control the ejection pressure individually in each ejection nozzle, or to set the ejection pressure to the same pressure, or different pressures, at each ejection nozzle.

Furthermore, the compressed gas may be ejected from the ejection nozzles in a perpendicular direction with respect to the surface of the substrate, or it may be ejected in an oblique direction.

In the flow-casting step, desirably, the flow-casting of the adhesive by the flow-casting unit is halted in such a manner that the adhesive is not caused to extend beyond the mounting region of the electronic component on the substrate. In this case, the adhesive is prevented from flowing or being scattered unintentionally outside the mounting region of the electronic component during the flow-casting of the adhesive, and therefore the production yield can be improved.

There are no particular restrictions on the flow-casting halting unit, provided that it is capable of halting (inhibiting) the flow and spread of the adhesive, and the unit may be selected appropriately according to the intended use; for example, it may be an ejection nozzle, or the like. The details of the ejection nozzle are as described in relation to the flow-casting unit above.

There are no particular restrictions on the installation position of the flow-casting unit, and it can be selected appropriately according to the intended use. Desirably, the flow-casting unit is arranged in the shape of a frame at a position which surrounds the mounting region of the electronic component on the substrate. In this case, it is possible to prevent the adhesive from spreading beyond the mounting region of the electronic component on the substrate.

If the flow-casting halting unit is an ejection nozzle, then desirably, the compressed gas described above is ejected from the ejection nozzle. An air barrier (air curtain) can be created by means of this compressed gas, and therefore the flow and spread of the adhesive can be halted by this barrier.

Furthermore, in this case, in order to be able to halt the flow and spread of the adhesive more reliably, it is desirable that the ejection nozzle forming a flow-casting unit and the ejection nozzle forming a flow-casting halting unit be provided in such a manner that they can eject compressed gas, while controlling the ejection pressure, in a mutually independent fashion. For example, if compressed gas is ejected from the ejection nozzle forming the flow-casting halting unit before ejecting compressed gas from the ejection nozzle forming the flow-casting unit, and if the ejection pressure is set a higher pressure than the ejection pressure of the compressed gas from the flow-casting halting unit, then it is possible to halt the unintentional flow of the adhesive outside the mounting region of the electronic component, in an effective fashion.

Desirably, the flow-casting unit can be moved swingably in a direction parallel to the surface of the substrate. In this case, it is possible to cause the adhesive to flow and spread (by pushing the adhesive) over a desired region, and it is also possible to apply the adhesive reliably to the substrate, without creating any gaps.

By means of the steps described above, the adhesive is flow-cast by means of a flow-casting unit, in such a manner that the expression $S_1/S_0 > 1$ is satisfied, where $S_0$ is the total contact surface area between the substrate and the adhesive supplied to the substrate and $S_1$ is the total contact surface area between the substrate and the adhesive after the flow-casting.

It is desirable that at least one of the supplying step and the flow-casting step include heating of the adhesive. In this case, it is possible to reduce the viscosity of the adhesive and to improve the fluidity of the adhesive, and therefore the adhesive can be made to flow and spread more rapidly when the adhesive is spread by the flow-casting unit, and furthermore, the adhesive can be supplied to the surface of the substrate without creating any gaps. Consequently, it is possible further to suppress the occurrence of gas bubbles in the adhesive, at the interface with the substrate.

If the adhesive is in the form of a paste, for example, then this heating can be achieved by heating the device used to apply the adhesive, by means of a heater, or the like, or by heating the stage on which the substrate is mounted or held by suction, by means of a heater, or the like.

The heating temperature is desirably one at which the viscosity of the adhesive is reduced but the adhesive is not thermally cured, and a desirable temperature is in the range of 30° C. to 120° C., for example.

Furthermore, it is also possible to include the supplying step described above after the flow-casting step. In this case, the adhesive is supplied to the substrate in a plurality of separate operations. For example, if the supplying step is divided into two operations, then it is possible to reduce the amount of the adhesive that is supplied in the first supplying step, and therefore it is possible to reduce the thickness of the adhesive layer when the adhesive is flow-cast. Therefore, it is possible readily to fill in gaps at the interface between the adhesive and the substrate, and hence the adhesive can be deposited reliably, without creating any gaps. Subsequently, in the second supplying step, when further adhesive of an amount sufficient to mount the electronic component on the substrate is supplied, it is possible to control the adhesive in such a manner that an excessive amount of the adhesive is not caused to flow and ooze out beyond the outer perimeter of the electronic component during mounting. As a result, it is possible to prevent adherence of the adhesive to the bonding tool which holds the electronic component by suction during flip chip mounting, and therefore it is possible to suppress decline in the production yield.

(Curing Step)

The curing step is a step of curing the adhesive.

In the curing step, the adhesive is cured while making contact with (being filled in between) the electronic component and the substrate, in a state where the bumps are abutted against the bonding pads.

Desirably, the bumps and the bonding pads are abutted together by aligning the bumps in positions for abutment with the bonding pads, by means of the bonding tool which holds the electronic component by suction, and in this aligned state, pressing the bumps against the bonding pads. In this case, the bumps and the bonding pads are connected together reliably, and the electronic component can be mounted by flip chip mounting onto the substrate.

The gap between the electronic component and the substrate interface is filled with the adhesive by using the bonding tool, for example, by pressurizing (pressing) the adhesive via the electronic component.

In this case, the pressurization is carried out simultaneously with abutment of the bumps and the bonding pads.

There are no particular restrictions on the pressure used in the pressurization described above, and the pressure can be selected appropriately according to the intended use; if gold bumps formed by a wire bonding method are used, for example, then a desirable pressure is 40 mN/bump to 300 mN/bump.

If the pressure is less than 40 mN/bump, then the filling of the adhesive may not be performed satisfactorily, and it may not be possible to connect the bumps and the bonding pads reliably, whereas if the pressure is greater than 300 mN/bump, then damage may occur in the electronic component or the substrate, an excessive amount of the adhesive may ooze out from between the electronic component and the substrate, and this adhesive may flow unintentionally onto the substrate or become attached to the bonding tool.

Desirably, the curing of the adhesive is performed by heating the adhesive; for example, desirably, the adhesive is cured by means of a heated bonding tool. If a heated bonding tool is used to pressurize the adhesive via the electronic component, then the heat of the bonding tool is transmitted to the adhesive via the electronic component, and hence the adhesive can be cured.

There are no particular restrictions on the heating temperature of the bonding tool, and the temperature can be selected appropriately according to the intended use. A desirable heating temperature is 150° C. to 250° C., for example.

Furthermore, the adhesive can also be cured by heating the substrate or the stage which carries or suctions the substrate, by means of a heater, or the like. In this case, the heating temperature of the substrate is approximately 30° C. to 120° C., for example.

There are no particular restrictions on the pressurization time of the adhesive by means of the heated bonding tool (bonding time:heating and pressurization time), and the time can be selected appropriately according to the intended use, but a time of approximately 1 second to 10 seconds is desirable.

There are no particular restrictions on the bonding tool used, provided that it is capable of holding the electronic component by suction, and hence the bonding tool can be selected appropriately according to the intended use.

The electronic component is held and suctioned by means of suction holes provided in the bonding tool, for example.

Desirably, the bonding tool holds the electronic component by suction via a member which has non-adhesive properties with respect to the adhesive, and pressurizes the adhesive via this non-adhesive member. In this case, even if the adhesive oozes and creeps out beyond the outer perimeter of the electronic component during flip chip mounting, it is possible to prevent this adhesive from adhering to the bonding tool, due to the member which has non-adhesive properties. Therefore, it is possible to improve the manufacturing margin and the production yield, when the amount of the adhesive supplied, and the total contact surface area between the adhesive and the substrate after the flow-casting of the adhesive is set to $S_1$. Furthermore, if the electronic component has a small thickness, then problems of adherence of the adhesive to the bonding tool are liable to arise, but due to the presence of the non-adhesive member, the adhesive can be prevented from adhering to the bonding tool and therefore it is possible to respond satisfactorily to reduction in the thickness of the electronic component.

There are no particular restrictions on the material, shape, structure, or the like, of the member which has non-adhesive properties with respect to the adhesive, and these can be selected appropriately according to the intended use.

There are no particular restrictions on the material of the member, provided that it is not adhesive with respect to the adhesive, and the material can be selected appropriately according to the intended use. A desirable example of the material is fluorine resin.

There are no particular restrictions on the fluorine resin and it may be selected appropriately according to the intended use, for example, it may be PTFE (polytetrafluoroethylene resin), ETFE (ethylene tetrafluoroethylene copolymer resin), PFA (tetrafluoroethylene-perfluoroalkyl vinyl ether copolymer resin), FEP (tetrafluoroethylene-hexafluoropropylene copolymer resin), or the like. Of these, ETFE is desirable, from the viewpoint of processing formability and manufacturing costs.

There are no particular restrictions on the shape of the member, and the shape can be selected appropriately according to the intended use; for example, a film shape or sheet shape, or the like, can be adopted. Furthermore, if the member has a film shape, then it can be used in the form of a roll which is wound up about a cylindrical winding core.

There are no particular restrictions on the structure of the member, and the structure can be selected appropriately according to the intended use. A single-layer structure or a laminated structure may be adopted.

By means of the steps described above, the adhesive is cured while lying in contact with (being filled in between) the electronic component and substrate.

As a further step to those described above, it is also possible to carry out another heating step (post-curing) in order to increase the curing rate of the adhesive, after the curing step (bonding) described above.

The temperature in the post-curing step is desirably 150° C. to 200° C., and the post-curing time is between 30 minutes and 60 minutes.

Here, one example of the method of manufacturing a semiconductor device according to the present invention will be described with reference to the drawings.

Figure 1B:
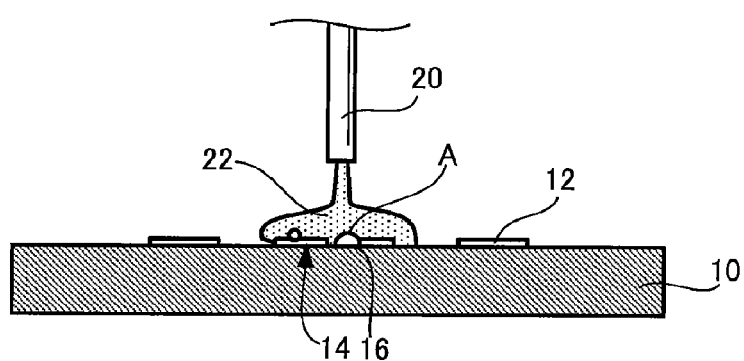
FIG. 1B is a step diagram for describing one example of a supplying step in the method for manufacturing a semiconductor device according to the present invention.
Figure 1C:
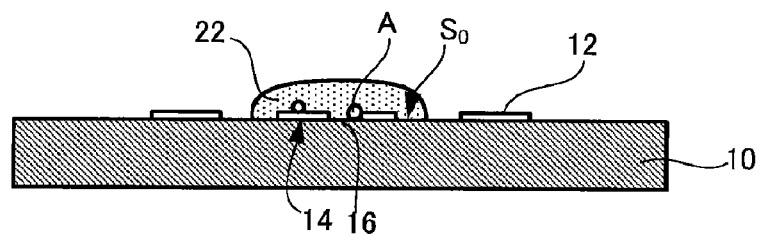
FIG. 1C is a schematic illustrative diagram showing one example of the state of an adhesive after the supplying step in the method for manufacturing a semiconductor device according to the present invention.

Firstly, as shown in FIG. 1A, bonding pads 12 having bump junction sections 11, and a wiring pattern 14 are formed on the front surface of a substrate 10, and as shown in FIG. 1B, an adhesive 22 in the form of a paste is ejected from an ejection nozzle 20 toward the central portion of the region where the electronic component is to be mounted on the substrate 10 (the central portion of the substrate 10). In this case, a gas bubble A is incorporated inside the adhesive 22, and as shown in FIG. 1B and FIG. 1C, a gas bubble A arises inside the adhesive 22 on the wiring pattern 14 and a recess section 16 present between the substrate 10 and the wiring pattern 14. The above corresponds to the supplying step described above.

Figure 2A:
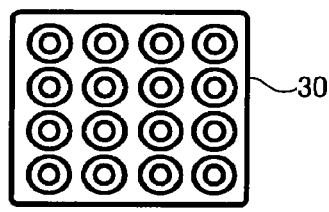
FIG. 2A is a schematic illustrative diagram showing one example of a flow-casting unit used in the method for manufacturing a semiconductor device according to the present invention.
Figure 2B:
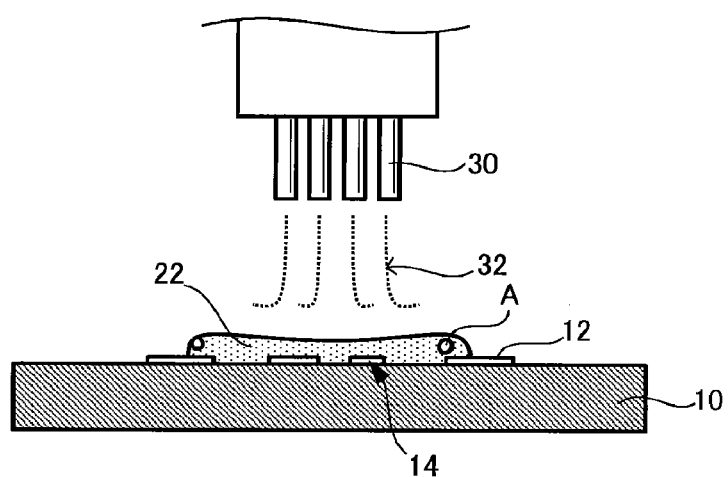
FIG. 2B is a step diagram for describing one example of a flow-casting step in the method for manufacturing a semiconductor device according to the present invention.
Figure 3:
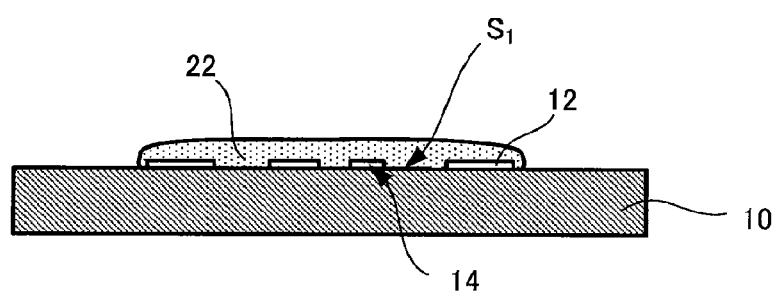
FIG. 3 is a schematic illustrative diagram showing one example of the state of an adhesive after the flow-casting step in the method for manufacturing a semiconductor device according to the present invention.

Thereupon, a compressed gas 32 is ejected onto the adhesive 22 in a perpendicular direction, as shown in FIG. 2B, using an ejection nozzle 30 which forms the flow-casting unit and has a cross-sectional shape such as that shown in FIG. 2A, and the adhesive 22 is thereby pressed against the substrate 10. In so doing, the gas bubbles A are also pressed and caused to flow inside the adhesive 22 and moved toward the outer sides of the adhesive 22. In this case, if the total contact surface area between the substrate 10 and the adhesive 22 supplied to the substrate 10 is $S_0$ (see FIG. 1C) and if the total contact surface area between the substrate 10 and the adhesive 22 after the flow-casting is $S_1$, as shown in FIG. 3, then by flow-casting or causing the adhesive to flow and spread so that the expression $S_1/S_0 > 1$ is satisfied, then the region occupied by the adhesive 22 increases, in such a manner that the bonding pads 12 are covered, the gas bubbles A are expelled to the exterior of the adhesive 22, and the presence of gas bubbles A in the adhesive 22 is reduced. The above corresponds to the flow-casting step described above.

Figure 4A:
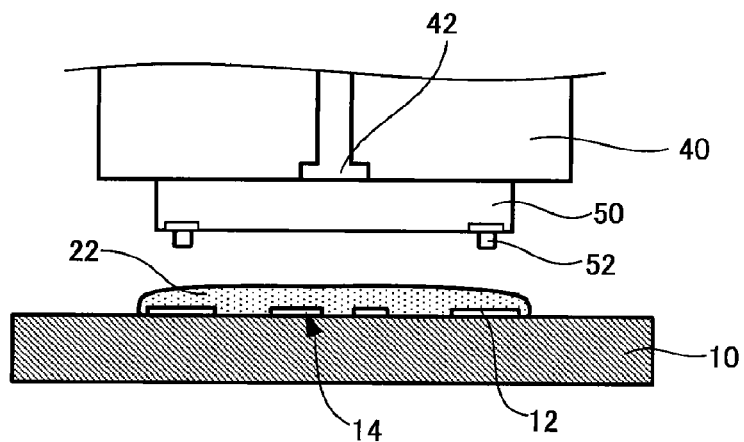
FIG. 4A is a step diagram (the first step diagram) for describing one example of a curing step in the method for manufacturing a semiconductor device according to the present invention.
Figure 4B:
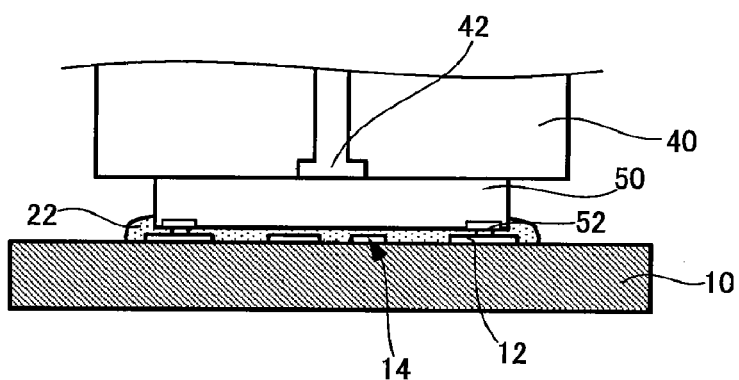
FIG. 4B is a step diagram (the second step diagram) for describing one example of a curing step in the method for manufacturing a semiconductor device according to the present invention.

As shown in FIG. 4A, a semiconductor chip 50 forming the electronic component is suctioned by a suction hole 42 provided in the bonding tool 40, whereby the semiconductor chip 50 is held by the bonding tool 40. Furthermore, a plurality of bumps 52 corresponding to the bonding pads 12 formed on the semiconductor chip 50 are aligned in positions for abutment with the bonding pads 12, by means of the bonding tool 40. Thereupon, in this aligned state, the bonding pads 12 and the bumps 52 are abutted against each other, as shown in FIG. 4B. The bonding tool 40 is then heated, the adhesive 22 is pressurized by the heated bonding tool 40, and the adhesive 22 is cured while lying in contact with (being filled in between) the semiconductor chip 50 and the substrate 10. The above corresponds to the curing step described above.

Figure 5:
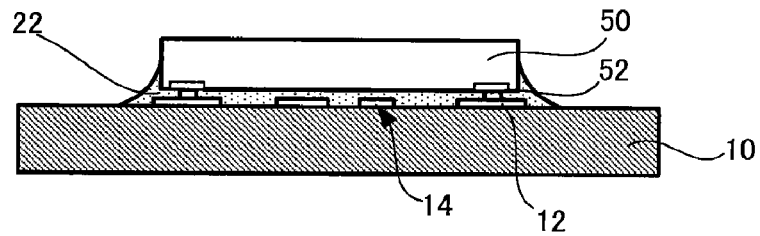
FIG. 5 is a schematic illustrative diagram showing one example of a semiconductor device manufactured by the method for manufacturing a semiconductor device according to the present invention.

From the above, the semiconductor chip 50 having a plurality of bumps 52 is mounted (by flip chip mounting) onto the substrate 10 which has a plurality of bonding pads 12 corresponding to the bumps 52, in a state where the bumps 52 and the bonding pads 12 are mutually opposed and connected together, thereby forming the semiconductor device according to the present invention as shown in FIG. 5.

There are no particular restrictions on the shape, structure, size, or the like, of the semiconductor device of the present invention which is manufactured by the method for manufacturing a semiconductor device according to the present invention, and these factors can be selected appropriately according to the intended use.

There are no particular restrictions on the interval between bumps (bump pitch) in the semiconductor device, and the bump pitch can be selected appropriately according to the intended use, but if using gold bumps formed by a wire bonding method, for example, then generally the bump pitch is approximately 35 μm to 120 μm, and desirably it is 40 μm or less.

If the bump pitch is 40 μm or less, then there is marked occurrence of gas bubbles and there is a latent problem of deterioration in the properties of the semiconductor device due to connection faults in the bump junctions or electric current leakage between mutually adjacent bumps, or the like. However, in the semiconductor device according to the present invention which is manufactured by the method for manufacturing a semiconductor device according to the present invention (where the electronic component is mounted on the substrate), even in cases where the bump pitch is extremely fine, namely, 40 μm or less, the occurrence of gas bubbles inside the adhesive is reduced and therefore high performance and high reliability are achieved.

If the electronic component in the semiconductor device according to the present invention is a semiconductor chip, then although the presence rate of gas bubbles on the surface of the semiconductor chip varies depending on the layout and pitch of the bumps, the material used for the adhesive, and the like, the lower the presence rate of gas bubbles, the more desirable. If the presence rate of gas bubbles is high, then this presence of gas bubbles can give rise to problems, such as connection faults at the bump junction sections due to swelling and detachment of the adhesive, or the occurrence of electric current leakages between mutually adjacent bumps due to the effects of moisture, impurity ions, and the like, inside the gas bubbles.

If there are two or more semiconductor chips, then the presence rate of gas bubbles means the presence rate of gas bubbles in an individual semiconductor chip.

According to the method of manufacturing a semiconductor device according to the present invention, it is possible to manufacture, at low cost and with high efficiency, a semiconductor device having high performance and high reliability, in which an electronic component is mounted on a substrate by using an adhesive (for example, by flip chip mounting), while restricting the occurrence of gas bubbles inside the adhesive.

Since the occurrence of gas bubbles inside the adhesive is reduced when the electronic component is mounted onto the substrate using an adhesive (for example, by flip chip mounting), then the semiconductor device according to the present invention has high performance and high reliability, and there is no occurrence of connection faults in the bump junction sections as a result of swelling or delamination of the adhesive, and no occurrence of electric current leakage between the mutually adjacent bumps due to the effects of moisture, impurity ions, or the like, inside the gas bubbles.

EXAMPLES

The present invention is described in more specific terms below by means of examples and comparative examples, but the present invention is not limited to these examples.

Example 1

Manufacture of Semiconductor Device

Firstly, as shown in FIG. 1A, 392 bonding pads 12 having bump junction sections 11, and a wiring pattern 14, were formed on the front surface of a two-layered substrate 10 made of a glass-BT (bismaleide triazine), which was used as the substrate described above, and as shown in FIG. 1B, a thermally curable insulating epoxy resin 22 in the form of a paste, which was used as the adhesive described above, was ejected from an ejection nozzle 20 onto the two-layered substrate 10, towards the central portion of the region where an electronic component (the semiconductor chip 50 in FIG. 4A) was to be mounted (namely, the central portion of the substrate 10). In this case, gas bubbles A were incorporated into the adhesive 22, and as shown in FIG. 1B and FIG. 1C, gas bubbles A occur inside the adhesive 22 on the wiring pattern 14 and a recess section 16 present between the two-layered substrate 10 and the wiring pattern 14. The above corresponds to the supplying step of the method for manufacturing a semiconductor device according to the present invention.

Figure 6:
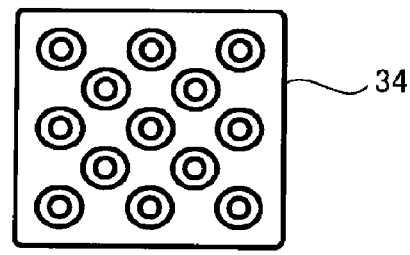
FIG. 6 is a schematic cross-sectional diagram of a flow-casting unit used in the method of manufacturing a semiconductor device according to Example 1.

Thereupon, using a 13-orifice multiple nozzle 34 as the flow-casting unit described above, the multiple nozzle 34 having 13 ejection holes and the ejection holes being disposed as shown in FIG. 6, a compressed gas (air) 32 was ejected onto the adhesive 22 in a perpendicular direction, as shown in FIG. 2B, thereby pushing the adhesive 22 against the two-layered substrate 10. In so doing, the gas bubbles A were also pressed and caused to flow inside the adhesive 22 and moved toward the outer sides of the adhesive 22. The multiple nozzle 34 was made of stainless steel, and had a nozzle diameter of 0.2 mm. Furthermore, the distance between the front tip of the multiple nozzle 34 and the surface of the two-layered substrate 10 was 1.0 mm, and the ejection pressure of the compressed gas 32 was 0.15 MPa.

Furthermore, taking the total contact surface area between the two-layered substrate 10 and the adhesive 22 supplied to the two-layered substrate 10 to be $S_0$ (see FIG. 1C), and taking the total contact surface area between the two-layered substrate 10 and the adhesive 22 after pressing to be $S_1$, as shown in FIG. 3, then when the adhesive 22 was caused to flow and spread or flow cast in such a manner that $S_o$ and $S_1$ could satisfy the expression $S_1/S_0>1$, the region occupied by the adhesive 22 increased so as to cover the bonding pads 12. In so doing, the gas bubbles A were expelled to the exterior of the adhesive 22 and the presence of gas bubbles A inside the adhesive 22 was reduced. The above corresponds to the flow-casting step of the method for manufacturing a semiconductor device according to the present invention.

As shown in FIG. 4A, a semiconductor chip 50 forming the electronic component was suctioned by the suction hole 42 provided in the bonding tool 40, whereby the semiconductor chip 50 was held by the bonding tool 40. The size of the semiconductor chip 50 was 6.2 mm×6.2 mm×200 µm. The two-layered substrate 10 was held by suction on a bonding stage (not illustrated), and the 392 bumps 52 corresponding to the bonding pads 12 formed on the semiconductor chip 50 were aligned in positions for abutment with the bonding pads 12, by the bonding tool 40.

The bumps 52 were stud bumps formed by ball bonding using gold wire, and the interval between mutually adjacent bumps 52 (the bump pitch) was 50 µm.

Furthermore, the bonding tool 40 was heated previously so as to maintain a uniform temperature and the semiconductor chip 50 was heated due to being suctioned against the bonding tool 40. The heating temperature was 225° C.

Furthermore, the bonding stage (not illustrated) was heated previously so as to maintain a uniform temperature and the two-layered substrate 10 was heated due to being suctioned against the bonding stage. The heating temperature was 40° C.

Thereupon, in an aligned state, the bonding pads 12 and the bumps 52 were abutted against each other, as shown in FIG. 4B. The adhesive 22 was pressurized by the heated bonding tool 40, thereby curing the adhesive 22 while making the adhesive 22 contact with the semiconductor chip 50 and the two-layered substrate 10 (the gap therebetween was filled with the adhesive 22). Furthermore, simultaneously, the bumps 52 were pressurized by the headed bonding tool 40, thereby causing the bumps 40 to undergo plastic deformation. The heating temperature was 215° C., the pressure was 160 mN/bump, and the bonding time (heating and pressurization time) was five seconds. The heating temperature 215° C. was the temperature of the adhesive 22 during bonding. The above corresponds to the curing step of the method for manufacturing a semiconductor device according to the present invention.

From the above, the semiconductor chip 50 having 392 bumps 52 is mounted (by flip chip mounting) onto the two-layered substrate 10 which has 392 bonding pads 12 corresponding to the bumps 52, in a state where the bumps 52 and the bonding pads 12 are connected together, thereby obtaining the semiconductor device shown in FIG. 5.

Comparative Example 1

Manufacture of Semiconductor Device

A semiconductor chip was mounted on a substrate (by flip chip mounting), thereby manufacturing a semiconductor device, in a similar manner to Example 1, with the exception that the flow-casting step in Example 1 was not carried out.

Example 2

Manufacture of Semiconductor Device

A semiconductor chip was mounted on a substrate (by flip chip mounting), thereby manufacturing a semiconductor device, in a similar manner to Example 1, with the exception that bumps were also formed on the bonding pads on the substrate in Example 1.

Figure 7A:
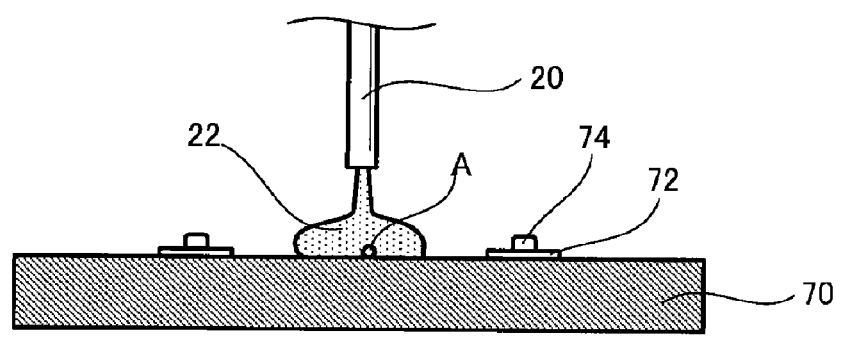
FIG. 7A is a step diagram for describing a supplying step in the method for manufacturing a semiconductor device according to Example 2.
Figure 7B:
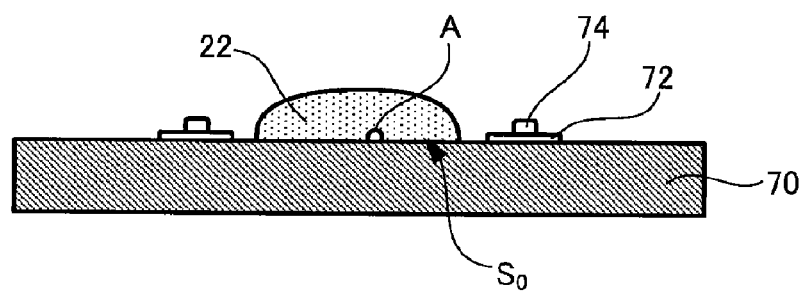
FIG. 7B is a schematic illustrative diagram showing the state of an adhesive after a supplying step in the method for manufacturing a semiconductor device according to Example 2.

Firstly, as shown in FIG. 7A, 740 bonding pads 72 and 740 bumps 74 made of gold created by electroplating on the bonding pads 72 were formed on the surface of a silicon substrate 70, which was used as the substrate described above, whereupon a thermally curable insulating epoxy resin 22 in the form of a paste, which forms the adhesive described above, was ejected from an ejection nozzle 20 toward the central portion of the region on the silicon substrate 70 where the electronic component (the semiconductor chip 80 in FIG. 10A) was to be mounted (the central portion of the substrate 70). In this case, gas bubbles A became incorporated into the adhesive 22, and as shown in FIG. 7A and FIG. 7B, gas bubbles A occurred inside the adhesive 22 in the vicinity of the interface between the silicon substrate 70 and the adhesive 22. The above corresponds to the supplying step of the method for manufacturing a semiconductor device according to the present invention.

Figure 8:
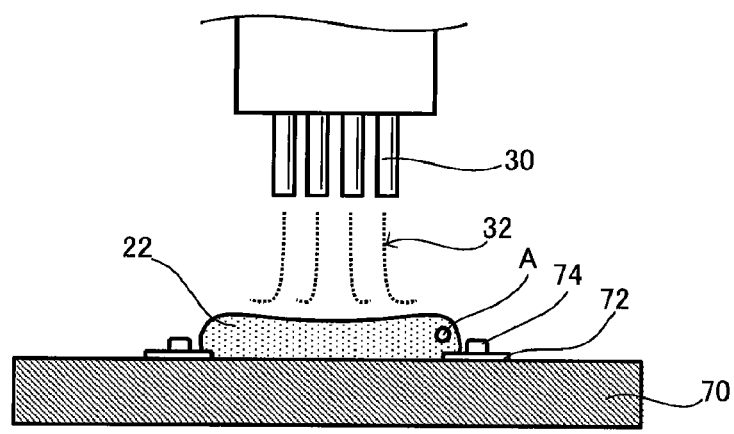
FIG. 8 is a step diagram for describing a flow-casting step in the method for manufacturing a semiconductor device according to Example 2.

Thereupon, using a 13-orifice multiple nozzle 34 as the flow-casting unit described above, the multiple nozzle 34 having 13 ejection holes and the ejection holes being disposed as shown in FIG. 6, compressed gas (air) 32 was ejected onto the adhesive 22 in a perpendicular direction, as shown in FIG. 8, thereby pressing the adhesive 22 against the silicon substrate 70. In so doing, the gas bubbles A were also pushed and caused to flow inside the adhesive 22 and moved toward the outer sides of the adhesive 22.

Figure 9:
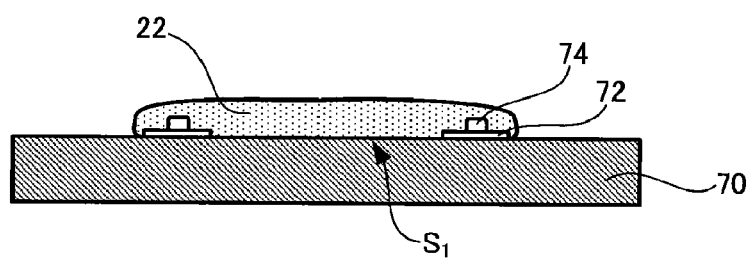
FIG. 9 is a schematic illustrative diagram showing the state of an adhesive after a flow-casting step in the method for manufacturing a semiconductor device according to Example 2.

Furthermore, taking the total contact surface area between the silicon substrate 70 and the adhesive 22 supplied to the silicon substrate 70 to be $S_0$ (see FIG. 7B), and taking the total contact surface area between the silicon substrate 70 and the adhesive 22 after pressing to be $S_1$, as shown in FIG. 9, then when the adhesive 22 was caused to flow and spread in such a manner that $S_0$ and $S_1$ could satisfy the expression $S_1/S_0>1$, the region occupied by the adhesive 22 increased so as to cover the bonding pads 72 and bumps 74. In so doing, the gas bubbles A were expelled to the exterior of the adhesive 22 and the presence of gas bubbles A inside the adhesive 22 was reduced. The above corresponds to the flow-casting step of the method for manufacturing a semiconductor device according to the present invention.

Figure 10A:
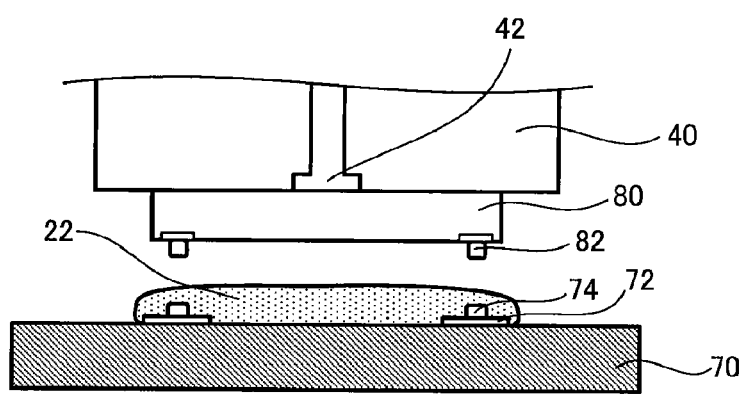
FIG. 10A is a step diagram (the first step diagram) for describing a curing step in the method for manufacturing a semiconductor device according to Example 2.

As shown in FIG. 10A, a semiconductor chip 80 forming the electronic component was suctioned by the suction hole 42 provided in the bonding tool 40, whereby the semiconductor chip 80 was held by the bonding tool 40. The size of the semiconductor chip 80 was 3.0 mm×5.0 mm×200 µm. The silicon substrate 70 was held by suction on a bonding stage (not illustrated), and the 740 bumps 82 corresponding to the bumps 74 formed on the semiconductor chip 80 were aligned in positions for abutment with the bumps 74, by the bonding tool 40. The bumps 82 were gold plating bumps formed by electroplating, and the interval between mutually adjacent bumps 82 (the bump pitch) was 20 µm. Furthermore, the bonding tool 40 was heated previously so as to maintain a uniform temperature and the semiconductor chip 80 was heated due to being suctioned against the bonding tool 40. The heating temperature was 220° C.

Furthermore, the bonding stage (not illustrated) was heated previously so as to maintain a uniform temperature and the silicon substrate 70 was heated due to being suctioned against the bonding stage. The heating temperature was 60° C.

Figure 10B:
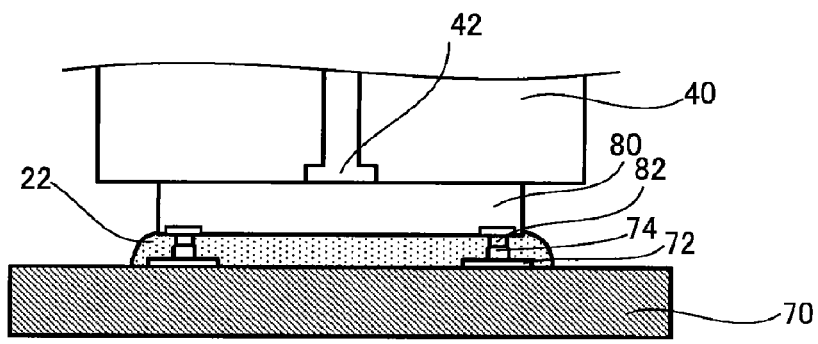
FIG. 10B is a step diagram (the second step diagram) for describing a curing step in the method for manufacturing a semiconductor device according to Example 2.

Thereupon, in an aligned state, the bumps 74 and the bumps 82 were abutted against each other, as shown in FIG. 10B. The adhesive 22 was pressurized by the heated bonding tool 40, thereby curing the adhesive 22 while causing the adhesive 22 to make contact with (become filled in between) the semiconductor chip 80 and the silicon substrate 70. Furthermore, simultaneously, the bumps 74 were pressurized by the headed bonding tool 40, thereby causing the bumps 74 and the bumps 82 to undergo plastic deformation. The heating temperature was 215° C., the pressure was 140 mN/bump, and the bonding time (heating and pressurization time) was five seconds. The heating temperature 215° C. was the temperature of the adhesive 22 during bonding. The above corresponds to the curing step of the method for manufacturing a semiconductor device according to the present invention.

Figure 11:
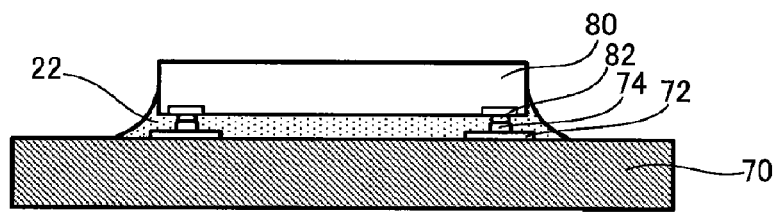
FIG. 11 is a schematic illustrative diagram showing a semiconductor device obtained by the method for manufacturing a semiconductor device according to Example 2.

By means of the above, the semiconductor chip 80 having 740 bumps 82 was mounted (by flip chip mounting) onto the silicon substrate 70 which has 740 bumps 74 corresponding to the bumps 82, in a state where the bumps 82 and the bumps 74 were connected together, thereby obtaining the semiconductor device shown in FIG. 11.

Comparative Example 2

Manufacture of Semiconductor Device

A semiconductor chip was mounted on a substrate (by flip chip mounting), thereby manufacturing a semiconductor device, in a similar manner to Example 2, with the exception that the flow-casting step in Example 2 was not carried out.

The presence rate (occurrence rate) of gas bubbles (voids) in the surface area of the semiconductor chip was evaluated by the following method, in the semiconductor devices obtained in the Examples 1 and 2 and the Comparative Examples 1 and 2.

More specifically, the cross-section of the region in the vicinity of the interface between the substrate and the adhesive was ground to a flat surface, the ground flat surface was observed using a scanning electron microscope (SEM), the voids which had occurred at the interface between the substrate and the adhesive were measured, and the occupancy rate of the voids with respect to the surface area of the semiconductor chip was evaluated, to obtain the void occurrence rate. In the evaluation process, five samples each were manufactured respectively by the methods of manufacture in Examples 1 and 2 and Comparative Examples 1 and 2, and the aforementioned evaluation was carried out respectively for each of the five samples. The results are shown in Table 1.

TABLE 1

|  | Void Occurence Rate (%) | | |
| --- | --- | --- | --- |
|  | Average | Max. | Min. |
| Example 1 | 0.02 | 0.04 | 0.00 |
| Example 2 | 0.01 | 0.02 | 0.00 |
| Comparative Example 1 | 1.44 | 2.43 | 0.21 |
| Comparative Example 2 | 0.67 | 0.91 | 0.43 |

From the results in Table 1, in the semiconductor devices according to Examples 1 and 2, there was virtually no occurrence of voids at the interface between the substrate and the adhesive, whereas in the case of Comparative Examples 1 and 2, the void occurrence rate was noted to be higher than in the Examples 1 and 2.

A moisture absorption reflow test was carried out on the basis of the method described below, using the semiconductor devices obtained from Examples 1 and 2 and Comparative Examples 1 and 2, whereupon the performance of the semiconductor devices was evaluated.

(Moisture Absorption Reflow Test)

The semiconductor devices of Examples 1 and 2 and Comparative Examples 1 and 2 were respectively taken and subjected to moisture absorption over a period of 72 hours at a temperature of 30° C. in an environment of 80% relative humidity, and then subjected to heat treatment at a peak temperature of 250° C. using an infrared reflow device. This sequence of moisture absorption and reflow processing was repeated two times, and 10 samples of each of the semiconductor devices of Examples 1 and 2 and Comparative Examples 1 and 2 were prepared. The external appearance and internal appearance of each of the samples thus obtained were examined by the method described below, and the conduction resistance was also investigated.

—Examination of External Appearance—

The external appearance was observed by using a stereomicroscope at a magnification rate of 20 times, and it was confirmed whether or not there were any abnormalities.

—Examination of Internal Appearance—

The internal appearance was examined using a scanning acoustic microscope, and it was confirmed whether or not delamination had occurred between the adhesive and the semiconductor chip interface, inside the semiconductor device, and between the adhesive and the substrate interface.

—Investigation of Conduction Resistance—

In order to investigate the conduction resistance, the connection reliability between the semiconductor chip and the substrate, connected in a daisy chain configuration via the bumps, was investigated by measuring the resistance value of the daisy chain and examining the variation in the resistance value. Here, the connection was judged to be defective in cases where the resistance value had increased by 10% with respect to the initial value after assembly.

The results of this examination and investigation showed no occurrence of defects, in any of the samples manufactured by using the Examples 1 and 2 and the Comparative Examples 1 and 2.

Thereupon, a reliability test was carried out using five samples, respectively, after the moisture absorption reflow test.

(Reliability Test)

In the reliability test, a temperature cycle test, a constant temperature and humidity test, an external appearance examination and a conduction resistance examination were carried out, as described below.

—Temperature Cycle Test—

The temperature cycle test was carried out by continuously and repeatedly placing respective samples in a low-temperature environment of −55° C. for 25 minutes and a high-temperature environment of 125° C. for 25 minutes.

—Constant Temperature and Humidity Test—

The constant temperature and humidity test was carried out by placing the respective samples in an environment having a temperature of 121° C. and a relative humidity of 85%.

After undergoing the temperature cycle test and the constant temperature and humidity test, the samples were subjected to the external appearance examination and the conduction resistance examination described below.

—Examination of External Appearance—

The external appearance was observed by using a stereomicroscope at a magnification rate of 20 times, and it was confirmed whether or not there were any abnormalities.

—Investigation of Conduction Resistance—

In order to investigate the conduction resistance, the connection reliability between the semiconductor chip and the substrate, connected in a daisy chain configuration via the bumps, was investigated by measuring the resistance value of the daisy chain and examining the variation in the resistance value. Here, the connection was judged to be defective in cases where the resistance value had increased by 10% with respect to the initial value after assembly.

The results of this examination and investigation showed no occurrence of defects in any of the samples after the temperature cycle test, up to 1,500 cycles in the case of Example 1, up to 1,000 cycles in the case of Example 2, up to 1,400 cycles in the case of Comparative Example 1, and up to 950 cycles in the case of Comparative Example 2.

The samples after the constant temperature and humidity test showed no occurrence of defects in any of the samples, up to 672 hours in the case of Example 1, up to 504 hours in the case of Example 2, up to 504 hours in the case of Comparative Example 1, and up to 336 hours in the case of Comparative Example 2.

By this means, compared to the semiconductor devices according to the Examples, in the semiconductor devices according to the Comparative Examples, it was observed that, due to the generation of voids, there was a higher possibility of the occurrence of connection faults at the bump junction sections, as a result of swelling or delamination of the adhesive, and electric current leakage between mutually adjacent bumps, as a result of the effects of moisture or impurity ions inside the gas bubbles, or the like.

Example 3

Figure 12:
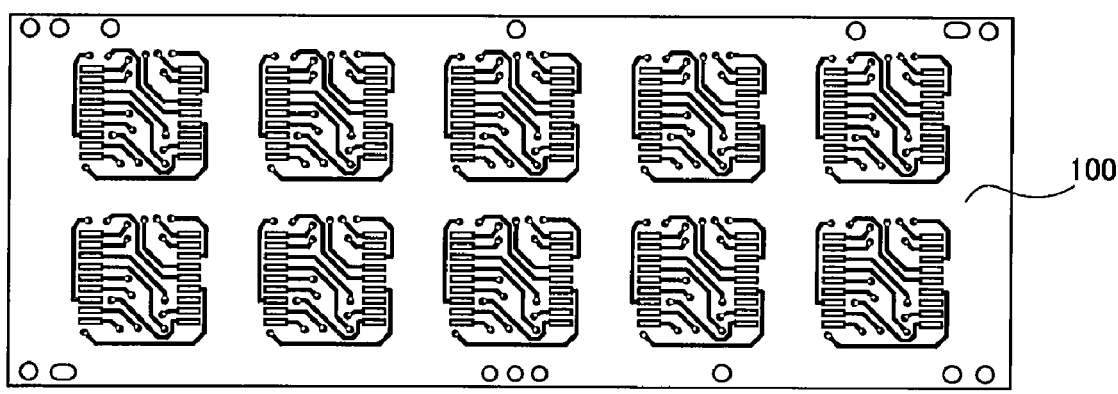
FIG. 12 is a schematic illustrative diagram showing a multiple-face substrate used in the method for manufacturing a semiconductor device according to Example 3.

Apart from the fact that a multiple-face substrate as shown in FIG. 12 was used as the substrate in Example 1, a semiconductor chip was mounted (by flip chip mounting) on a multiple-face substrate, thereby manufacturing a semiconductor device, in a similar manner to Example 1.

In Example 3, the adhesive supplying step, the flow-casting step and the curing step described above were carried out in a similar manner to Example 1, on the multiple-face substrate 100 shown in FIG. 12 (the substrate 100 is a 10-face substrate in FIG. 12), and therefore, semiconductor chips were mounted simultaneously, onto each of the respective 10 faces of the multiple-face substrate, and hence the production efficiency was improved.

Example 4

A semiconductor chip was mounted on a substrate (by flip chip mounting), thereby manufacturing a semiconductor device, in a similar manner to Example 1, with the exception that the supply shape of the adhesive on the substrate in the supplying step was changed in Example 1.

Figure 13A:
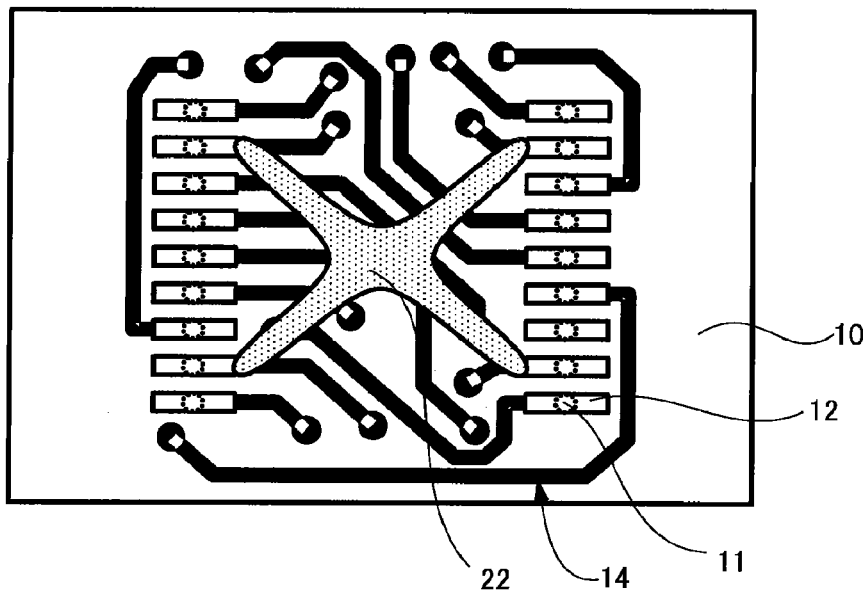
FIG. 13A is a schematic illustrative diagram showing a state of supplying an adhesive in a continuous form, in a supplying step of the method for manufacturing a semiconductor device according to Example 4.
Figure 13B:
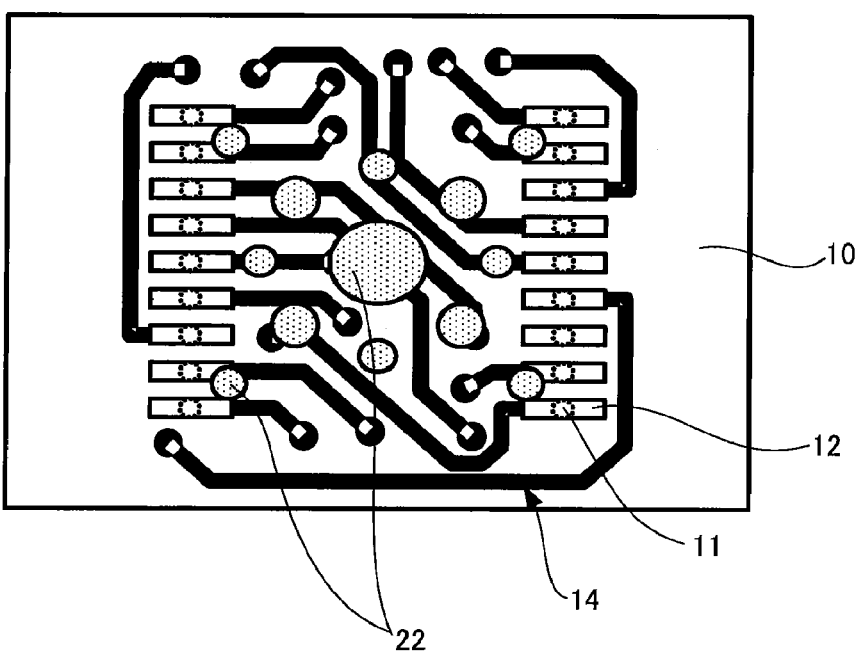
FIG. 13B is a schematic illustrative diagram showing a state of supplying an adhesive in a non-continuous form, in a supplying step of the method for manufacturing a semiconductor device according to Example 4.
Figure 13C:
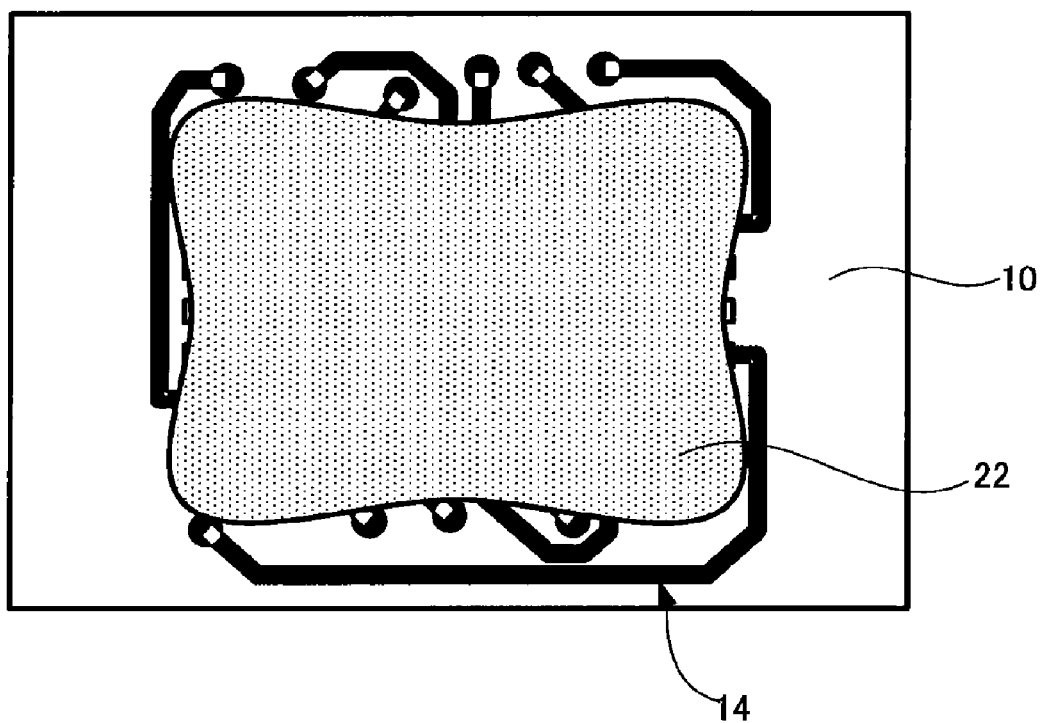
FIG. 13C is a schematic illustrative diagram showing the state of an adhesive after a flow-casting step in the method for manufacturing a semiconductor device according to Example 4.

In Example 4, the adhesive 22 was supplied in a schematic cross shape, forming a continuous form, as shown in FIG. 13A. Furthermore, as shown in FIG. 13B, the adhesive was supplied in a polka-dot pattern, forming a non-continuous form. In the case of both of the aspects of the supply shape of the adhesive 22, which are shown respectively in FIGS. 13A and 13B, in the flow-casting step, it was possible to cause the adhesive 22 to flow and spread (by being pushed) so as to cover the bump junction sections 11 (see FIG. 1A), as shown in FIG. 13C, and a semiconductor device having reduced occurrence of gas bubbles was manufactured.

Example 5

A semiconductor chip was mounted on a substrate (by flip chip mounting), thereby manufacturing a semiconductor device, in a similar manner to Example 1, with the exception that the flow-casting step in Example 1 was carried out by the method described below.

Figure 14A:
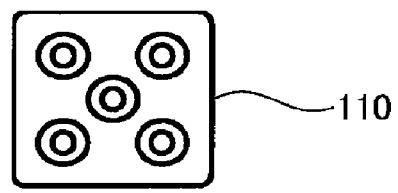
FIG. 14A is a schematic cross-sectional diagram of a flow-casting unit used in a first aspect of a flow-casting step in the method for manufacturing a semiconductor device according to Example 5.
Figure 14B:
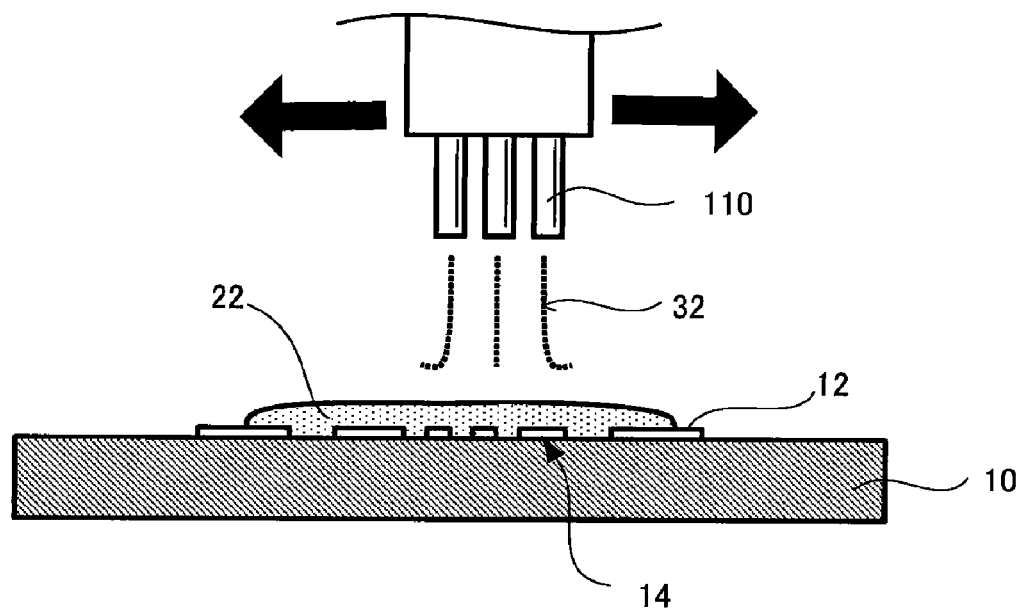
FIG. 14B is a step diagram for describing a flow-casting step in the method for manufacturing a semiconductor device according to Example 5.

In Example 5, in a first aspect of the flow-casting step, a nozzle 110 having five ejection holes, the ejection holes being disposed as shown in FIG. 14A, was used as the flow-casting unit. As shown in FIG. 14B, the nozzle 110 ejected a compressed gas (air) 32 toward the adhesive 22 in a perpendicular direction, while swinging in a direction parallel to the two-layered substrate 10, thereby pushing the adhesive 22 against the two-layered substrate 10. Furthermore, in this case, the ejection pressure of the compressed gas 32 was varied while the nozzle 110 performed a swinging movement. The front tips of the nozzle holes positioned in the outer perimeter portion of the nozzle 110 may be bent toward the outside, and the compressed gas 32 may be ejected onto the adhesive 22 in an oblique direction.

Figure 15A:
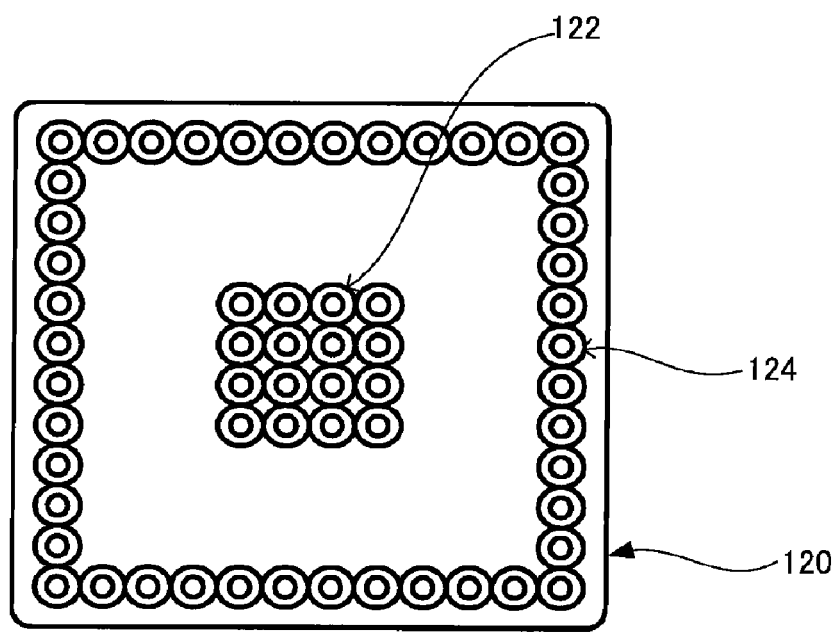
FIG. 15A is a schematic cross-sectional diagram of a flow-casting unit and a flow-casting halting unit used in a second aspect of a flow-casting step in the method for manufacturing a semiconductor device according to Example 5.
Figure 15B:
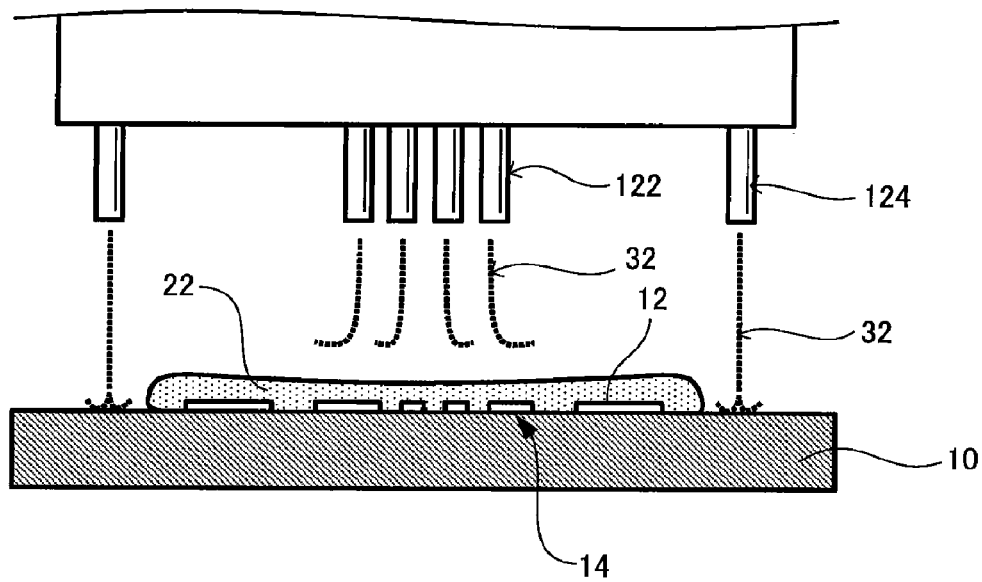
FIG. 15B is a step diagram for describing a second aspect of a flow-casting step in the method for manufacturing a semiconductor device according to Example 5.

Furthermore, in a second aspect of the flow-casting step, a nozzle 120 having a group of ejection holes 122 forming the flow-casting unit and a group of ejection holes 124 forming the flow-casting halting unit was used, the ejection holes being disposed as shown in FIG. 15A. In the nozzle 120, the ejection hole group (flow-casting unit) 122 for pressing the adhesive 22 was disposed in the central region of the nozzle 120, and the ejection hole group (flow-casting halting unit) 124 for controlling the flow of the adhesive 22 was disposed in the form of a frame, in a position corresponding to the outer perimeter of the mounting region of the semiconductor chip 50, so as to surround the outer perimeter of this region. As shown in FIG. 15B, firstly, the compressed gas 32 was ejected from the ejection hole group 124 disposed in the frame shape, whereupon a compressed gas 32 was ejected from the ejection hole group 122 disposed in the central region. Here, the ejection pressure of the compressed gas 32 was set so as to be greater in the ejection hole group 124 than in the ejection hole group 122. Consequently, while the adhesive 22 was pushed and caused to flow and spread by means of the compressed gas 32 from the ejection hole group 122, the adhesive 22 was prevented from flowing or scattering unintentionally to positions outside the mounting region of the semiconductor chip 50, by means of the compressed gas 32 from the ejection hole group 124.

Figure 16:
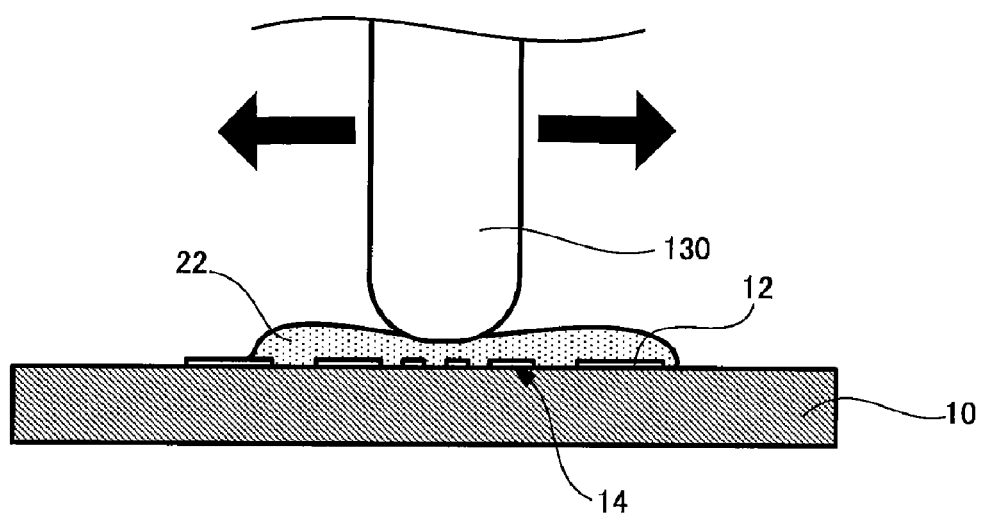
FIG. 16 is a schematic illustrative diagram of a flow-casting unit used in a third aspect of a flow-casting step in the method for manufacturing a semiconductor device according to Example 5.

Moreover, in a third aspect of the pressing step, a rod-shaped flow-casting member 130 was used as the flow-casting unit, as shown in FIG. 16. The flow-casting member 130 had a surface coating of a fluorine resin. The flow-casting member 130 pressed the adhesive 22 while performing a swinging movement in a direction parallel to the two-layered substrate 10 and maintaining a uniform distance from the two-layered substrate 10. The pressing member 130 would also be able to cause the adhesive 22 to flow and spread (by pushing the adhesive), in a similar manner, even if it had a spherical shape.

In Example 5, the occurrence of gas bubbles is reduced and a semiconductor device of high performance and high reliability is obtained, when the adhesive is flow-cast by means of the flow-casting step according to any one of the first to third aspects.

Example 6

A semiconductor chip was mounted on a substrate (by flip chip mounting), thereby manufacturing a semiconductor device, in a similar manner to Example 1, with the exception that the supplying step and the flow-casting step in Example 1 were carried out by the methods described below.

(Supplying Step)

Figure 17A:
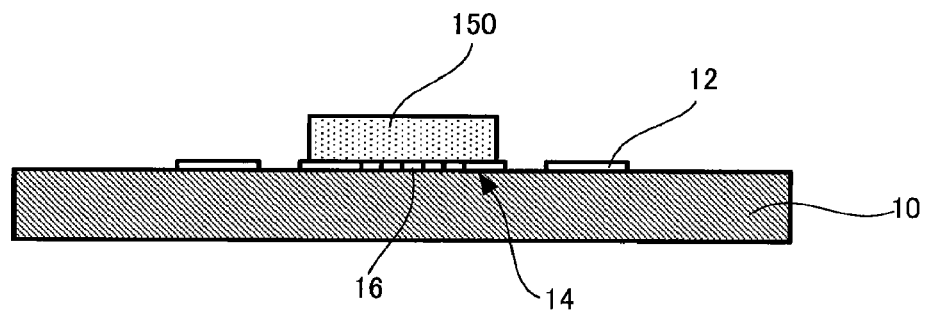
FIG. 17A is a step diagram for describing a supplying step in the method for manufacturing a semiconductor device according to Example 6.

Firstly, as shown in FIG. 17A, an adhesive 150 in the form of a film was attached to a two-layered substrate 10, while heating the two-layered substrate 10. The adhesive 150 generated tackiness due to being heated and softened by the two-layered substrate 10, and the filling properties of the adhesive into recess sections 16 of the two-layered substrate 10 (the undulations formed by the substrate 10 and a wiring pattern 14) were improved. The film of adhesive 150 was formed in such a manner that the area of the surface to which the adhesive was attached was smaller than the surface area of the mounting region of the semiconductor chip.

(Flow-Casting Step)

Figure 17B:
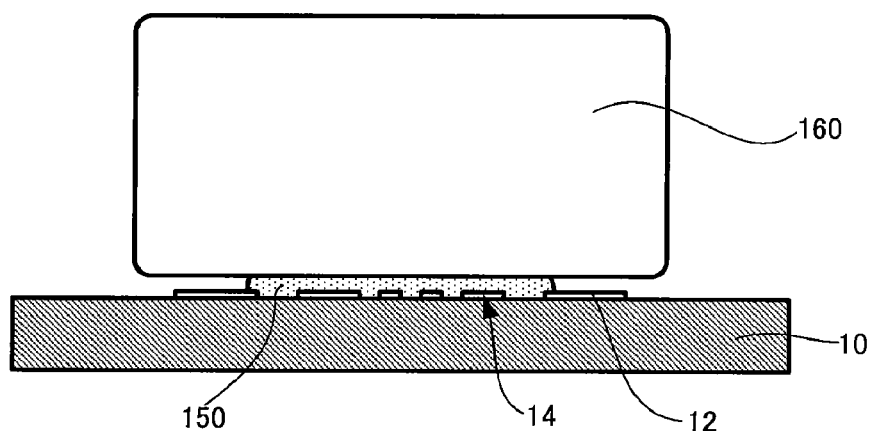
FIG. 17B is a step diagram for describing a flow-casting step in the method for manufacturing a semiconductor device according to Example 6.

Thereupon, a plate-shaped flow-casting member 160 forming the flow-casting unit was pressed toward the two-layered substrate 10 in a perpendicular direction as shown in FIG. 17B, while heating the adhesive 150 by heating the two-layered substrate 10, and hence the adhesive 22 was pressurized. The flow-casting member 160 had a surface coating of a fluorine resin.

In Example 6, an adhesive 150 in the form of a film was used and the adhesive 150 was caused to flow and spread while being heated, and therefore the filling properties of the adhesive 150 into the undulations present on the two-layered substrate 10 were improved, and a semiconductor device of high performance and high reliability, having reduced occurrence of gas bubbles, was obtained.

Example 7

A semiconductor chip was mounted (by flip chip mounting) on a substrate, thereby manufacturing a semiconductor device, in a similar manner to Example 1, with the exception that the supply of the adhesive to the substrate was divided into two operations, by carrying out the supplying step again, after the flow-casting step.

Figure 18A:
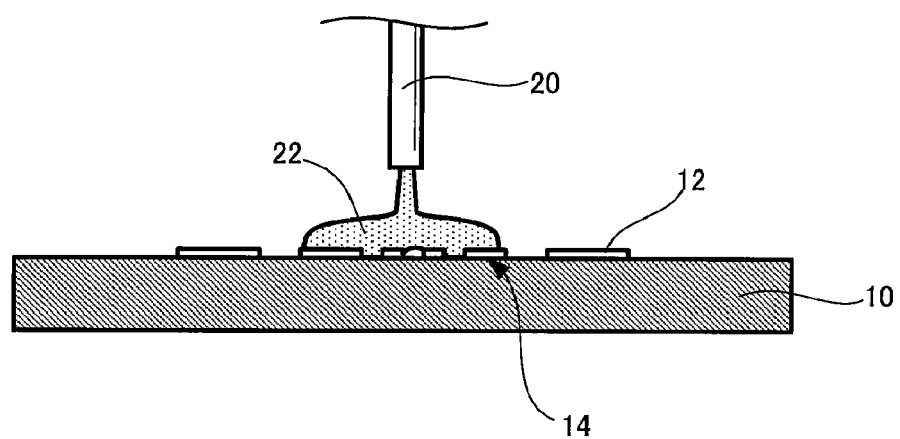
FIG. 18A is a step diagram for describing a first supplying step in the method for manufacturing a semiconductor device according to Example 7.
Figure 18B:
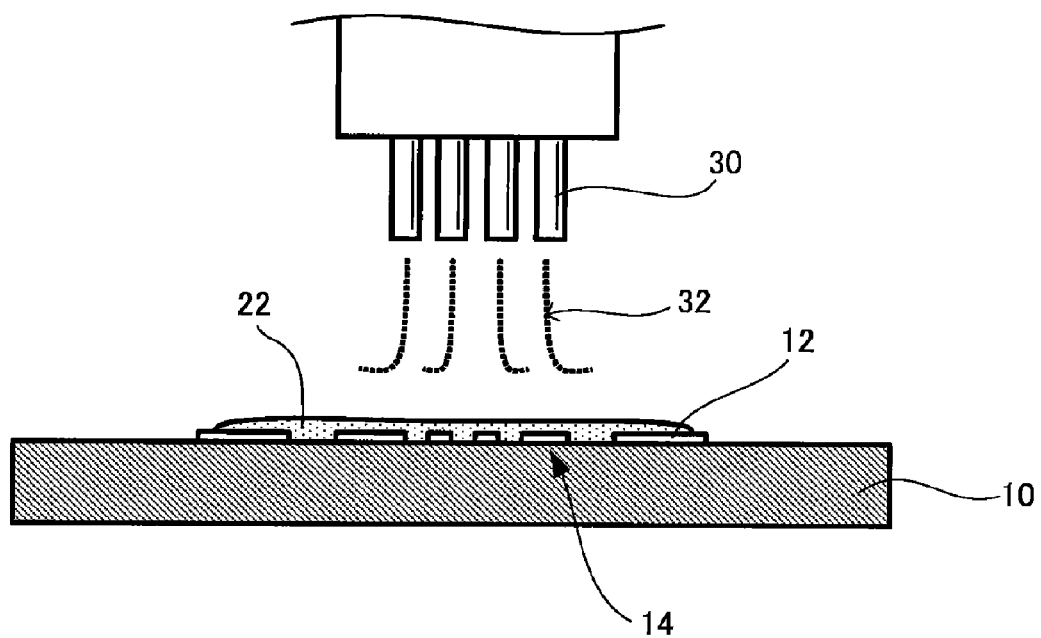
FIG. 18B is a step diagram for describing a flow-casting step in the method for manufacturing a semiconductor device according to Example 7.
Figure 18C:
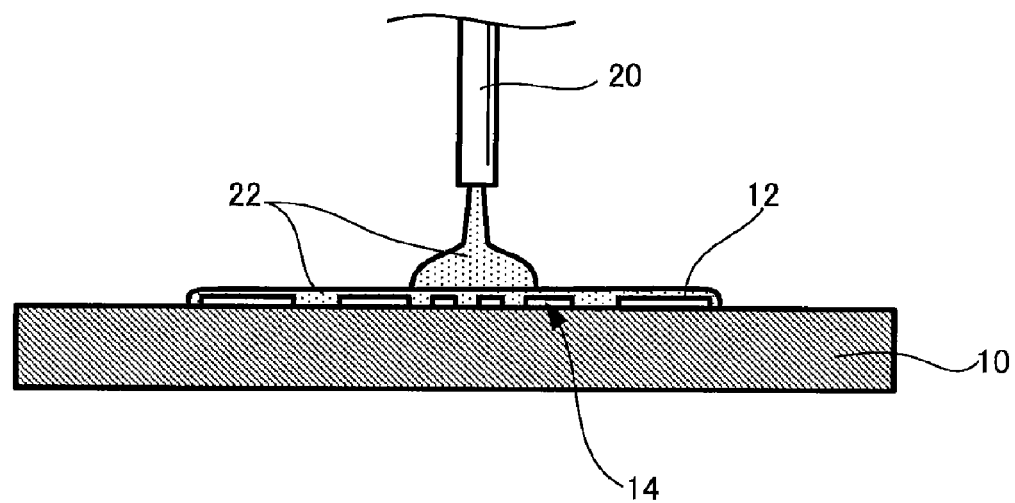
FIG. 18C is a step diagram for describing a second supplying step in the method for manufacturing a semiconductor device according to Example 7.

In Example 7, firstly, as shown in FIG. 18A, a smaller quantity of an adhesive 22 than in Example 1 was supplied in the supplying step. Thereupon, as shown in FIG. 18B, in the flow-casting step, the adhesive 22 was pressed and caused to flow and spread (by being pushed), so as to form an adhesive layer having a smaller thickness than in the Example 1. Furthermore, as shown in FIG. 18C, the supplying step was carried out again (a second supplying step), thereby supplying the adhesive 22. Thereupon, the flow-casting step and the curing step were carried out, thereby manufacturing a semiconductor device. The flow-casting step may be omitted in the case of the adhesive 22 which is supplied by the second supplying step.

In Example 7, since the adhesive layer formed by the first supplying step was thin, then it was possible to fill the gaps between the adhesive and the substrate interface readily, and the adhesive can be filled in a reliable fashion. Therefore, a semiconductor device of high performance and high reliability, having reduced occurrence of gas bubbles, can be obtained.

Example 8

A semiconductor chip was mounted on a substrate (by flip chip mounting), thereby manufacturing a semiconductor device, in a similar manner to Example 1, with the exception that the curing step in Example 1 was carried out by the method described below.

Figure 19A:
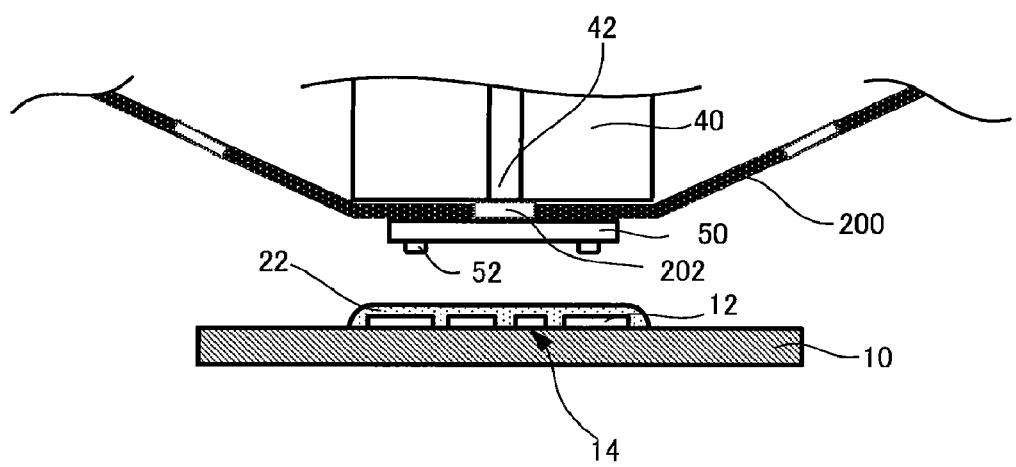
FIG. 19A is a step diagram (the first step diagram) for describing a curing step in the method for manufacturing a semiconductor device according to Example 8.
Figure 19B:
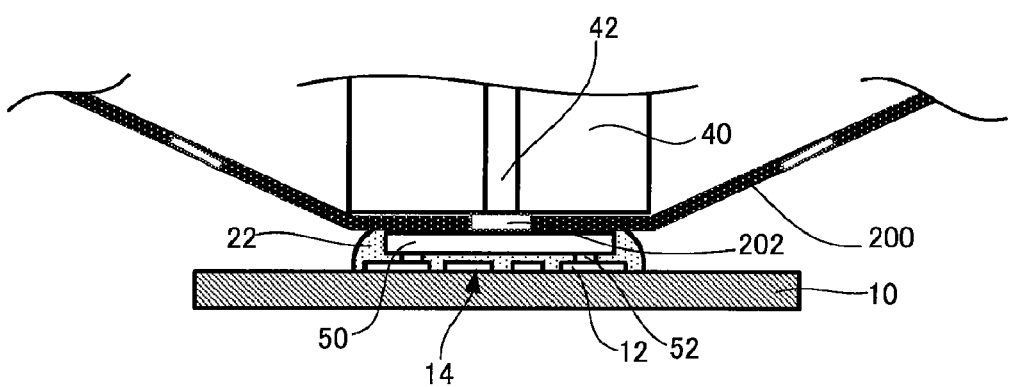
FIG. 19B is a step diagram (the second step diagram) for describing a curing step in the method for manufacturing a semiconductor device according to Example 8.
Figure 19C:
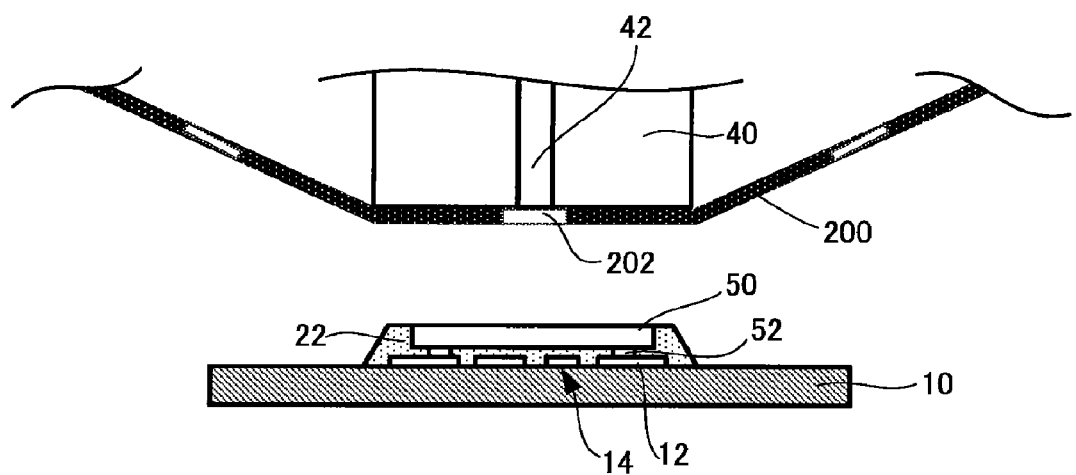
FIG. 19C is a step diagram (the third step diagram) for describing a curing step in the method for manufacturing a semiconductor device according to Example 8.

In Example 8, in the curing step, firstly, a semiconductor chip 50 was held by suction on a bonding tool 40 via a fluorine resin film 200 having an opening section 202, as shown in FIG. 19A. Here, the semiconductor chip 50 was suctioned and held on the bonding tool 40 by means of a suction hole 42 and the opening section 202. Thereupon, as shown in FIG. 19B, the bumps 52 were aligned in positions for abutment with the bonding pads 12, and in this state, the bonding pads 12 and the bumps 52 were abutted against each other. The bonding tool 40 was then heated, the adhesive 22 was pressurized by the heated bonding tool 40, via the fluorine resin film 200, and the adhesive 22 was cured while lying in contact with (being filled in between) the semiconductor chip 50 and the two-layered substrate 10. Thereupon, as shown in FIG. 19C, the bonding tool 40 and the fluorine resin film 200 were withdrawn from the semiconductor chip 50. After each bonding operation, the fluorine resin film 200 is wound up so that the next opening section 202 is moved into position, and therefore, in the next bonding operation, the semiconductor chip 50 makes contact with a clean surface of the fluorine resin film 200.

In Example 8, even if the adhesive oozed and crept out beyond the outer perimeter of the electronic component during flip chip mounting, this adhesive was prevented from adhering to the bonding tool by the fluorine resin film, and therefore the production yield was improved. Furthermore, it was observed that due to the presence of the fluorine resin film, it is possible to respond satisfactorily to reduction in the thickness of the semiconductor chip (for example, a semiconductor chip having a thickness of 150 μm or less).

According to the method of manufacturing a semiconductor device of the present invention, it is possible to manufacture, at low cost and with high efficiency, a semiconductor device having high performance and high reliability, wherein an electronic component is mounted on a substrate by using an adhesive (for example, by flip chip mounting), while restricting occurrence of gas bubbles inside the adhesive.

Since the occurrence of gas bubbles inside the adhesive is reduced when the electronic component is mounted onto the substrate using an adhesive (for example, by flip chip mounting), the semiconductor device according to the present invention has high performance and high reliability, and there is no occurrence of connection faults in the bump junction sections as a result of swelling or delamination of the adhesive, and no occurrence of electric current leakage between the mutually adjacent bumps due to the effects of moisture, impurity ions, or the like, inside the gas bubbles.

What is claimed is:

1. A method for manufacturing a semiconductor device, comprising:

supplying an adhesive for bonding an electronic component which has a plurality of bumps with a substrate which has a plurality of bonding pads corresponding to the bumps, to at least a portion of the substrate, between the electronic component and the substrate, flow-casting the adhesive on the substrate by a flow-casting unit, in such a manner that the expression $S_1/S_0 > 1$ is satisfied, where $S_0$ is the total contact surface area with the substrate of the adhesive supplied to the substrate, and $S_1$ is the total contact surface area with the substrate of the adhesive after the flow-casting, and curing the adhesive while making the adhesive contact with the electronic component and the substrate in a state where the bumps are abutted against the bonding pads.

2. The method for manufacturing a semiconductor device according to claim 1, wherein the supplying step supplies the adhesive to the substrate in any one of aspects of a continuous form or a non-continuous form.

3. The method for manufacturing a semiconductor device according to claim 1, wherein the flow-casting unit is configured to eject a compressed gas.

4. The method for manufacturing a semiconductor device according to claim 3, wherein the ejection of the compressed gas is performed by any one of continuous ejection and pulse ejection.

5. The method for manufacturing a semiconductor device according to claim 4, wherein the flow-casting unit is configured to alter an ejection pressure of the compressed gas.

6. The method for manufacturing a semiconductor device according to claim 3, wherein the compressed gas is heated.

7. The method for manufacturing a semiconductor device according to claim 1, wherein the flow-casting of the adhesive is halted by a flow-casting halting unit in such a manner that the adhesive does not extend beyond the mounting region of the electronic component on the substrate.

8. The method for manufacturing a semiconductor device according to claim 1, wherein the flow-casting unit has a shape of any one of a sphere, a bar and a plate.

9. The method for manufacturing a semiconductor device according to claim 8, wherein at least the surface of the flow-casting unit which contacts with the adhesive is composed of a fluorine resin.

10. The method for manufacturing a semiconductor device according to claim 1, wherein the flow-casting unit is swingable in a direction parallel to the surface of the substrate.

11. The method for manufacturing a semiconductor device according to claim 1, further comprising heating of the adhesive in at least any one of the supplying step and the flow-casting step.

12. The method for manufacturing a semiconductor device according to claim 1, further comprising another supplying step after the flow-casting step.

13. The method for manufacturing a semiconductor device according to claim 1, wherein the curing of the adhesive is carried out by heating the adhesive.

14. The method for manufacturing a semiconductor device according to claim 1, wherein the abutment between the bumps and the bonding pads is performed by aligning the bumps in positions for abutment with the bonding pads, by a bonding tool which holds by suction the electronic component.

15. The method for manufacturing a semiconductor device according to claim 14, wherein the bonding tool holds by suction the electronic component via a member which has non-adhesive properties with respect to the adhesive, and applies a pressure to the adhesive via the member having non-adhesive properties.

16. The method for manufacturing a semiconductor device according to claim 15, wherein the member having non-adhesive properties is a film composed of a fluorine resin.

17. The method for manufacturing a semiconductor device according to claim 1, wherein the bump pitch is 40 μm or less.

* * * * *